United States Patent
More et al.

(10) Patent No.: US 12,328,940 B2
(45) Date of Patent: Jun. 10, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Shahaji B. More, Hsinchu (TW); Chandrashekhar Prakash Savant, Hsinchu (TW); Tien-Wei Yu, Kaohsiung (TW); Chia-Ming Tsai, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 299 days.

(21) Appl. No.: 17/865,328

(22) Filed: Jul. 14, 2022

(65) Prior Publication Data

US 2022/0352160 A1 Nov. 3, 2022

Related U.S. Application Data

(62) Division of application No. 16/934,916, filed on Jul. 21, 2020, now Pat. No. 11,784,187.

(Continued)

(51) Int. Cl.
*H10D 84/85* (2025.01)
*H10D 84/01* (2025.01)
*H10D 84/03* (2025.01)

(52) U.S. Cl.
CPC ....... *H10D 84/856* (2025.01); *H10D 84/0177* (2025.01); *H10D 84/038* (2025.01); *H10D 84/853* (2025.01)

(58) Field of Classification Search
CPC ....... H01L 21/823842; H01L 21/82345; H01L 27/0922; H01L 27/0924; H01L 27/092;
(Continued)

(56) References Cited

U.S. PATENT DOCUMENTS 8,912,607 B2 12/2014 Kwon et al.
10,283,417 B1 5/2019 Huang et al.
(Continued)

FOREIGN PATENT DOCUMENTS

DE 102018108163 A1 1/2019
TW 201916254 A 4/2019

OTHER PUBLICATIONS

Non-Final Office Action issued in U.S. Appl. No. 16/934,916, filed Sep. 16, 2022.
(Continued)

*Primary Examiner* — Michael M Trinh
(74) *Attorney, Agent, or Firm* — STUDEBAKER BRACKETT PLLC

(57) ABSTRACT

In a method of manufacturing a semiconductor device, a gate dielectric layer is formed over a channel region made of a semiconductor material, a first work function adjustment material layer is formed over the gate dielectric layer, an adhesion enhancement layer is formed on the first work function adjustment material layer, a mask layer including an antireflective organic material layer is formed on the adhesion enhancement layer, and the adhesion enhancement layer and the first work function adjustment material layer are patterned by using the mask layer as an etching mask. The adhesion enhancement layer has a higher adhesion strength to the antireflective organic material layer than the first work function adjustment material layer.

20 Claims, 20 Drawing Sheets

Related U.S. Application Data

(60) Provisional application No. 62/982,718, filed on Feb. 27, 2020.

(58) Field of Classification Search
CPC .............. H01L 27/088; H01L 29/4958; H01L 29/4966; H10D 84/038; H10D 84/0177; H10D 84/01; H10D 84/014; H10D 84/0193; H10D 84/856; H10D 84/853; H10D 84/851; H10D 84/852; H10D 84/83; H10D 84/85; H10D 84/8311; H10D 84/8312; H10D 84/83135; H10D 84/83138; H10D 84/8314; H10D 84/8316; H10D 84/835; H10D 84/836; H10D 84/837; H10D 84/839; H10D 64/666; H10D 64/667; H10D 64/668; H10D 64/669

See application file for complete search history.

(56) References Cited

U.S. PATENT DOCUMENTS

| | | | |
|---|---|---|---|
| 10,304,835 | B1 | 5/2019 | Tsai et al. |
| 2005/0156238 | A1 | 7/2005 | Wen et al. |
| 2010/0187610 | A1* | 7/2010 | Kwon ............. H01L 21/823807 438/587 |
| 2010/0203704 | A1* | 8/2010 | Inumiya ............ H01L 21/28167 257/E21.546 |
| 2011/0140207 | A1* | 6/2011 | Lin ....................... H01L 29/517 257/412 |
| 2015/0108577 | A1 | 4/2015 | Cai et al. |
| 2015/0263132 | A1 | 9/2015 | Liu et al. |
| 2017/0125298 | A1 | 5/2017 | Jangjian et al. |
| 2018/0076091 | A1* | 3/2018 | Jangjian ............. H01L 27/0924 |
| 2018/0108745 | A1* | 4/2018 | Li ..................... H01L 21/28026 |
| 2019/0131185 | A1* | 5/2019 | Huang ................. H01L 29/518 |
| 2019/0164766 | A1 | 5/2019 | Huang et al. |
| 2019/0318933 | A1 | 10/2019 | Liu et al. |
| 2019/0333826 | A1 | 10/2019 | Huang et al. |
| 2019/0385855 | A1 | 12/2019 | Chien et al. |
| 2020/0111854 | A1 | 4/2020 | Chung et al. |
| 2020/0176581 | A1* | 6/2020 | Lee ................. H01L 21/823821 |
| 2021/0074593 | A1 | 3/2021 | Savant et al. |
| 2022/0013412 | A1 | 1/2022 | Chen et al. |

OTHER PUBLICATIONS

Final Office Action issued in U.S. Appl. No. 16/934,916, filed Mar. 14, 2023.

Non-Final Office Action issued in U.S. Appl. No. 16/934,916, filed Nov. 12, 2021.

Final Office Action issued in U.S. Appl. No. 16/934,916, filed May 23, 2022.

\* cited by examiner

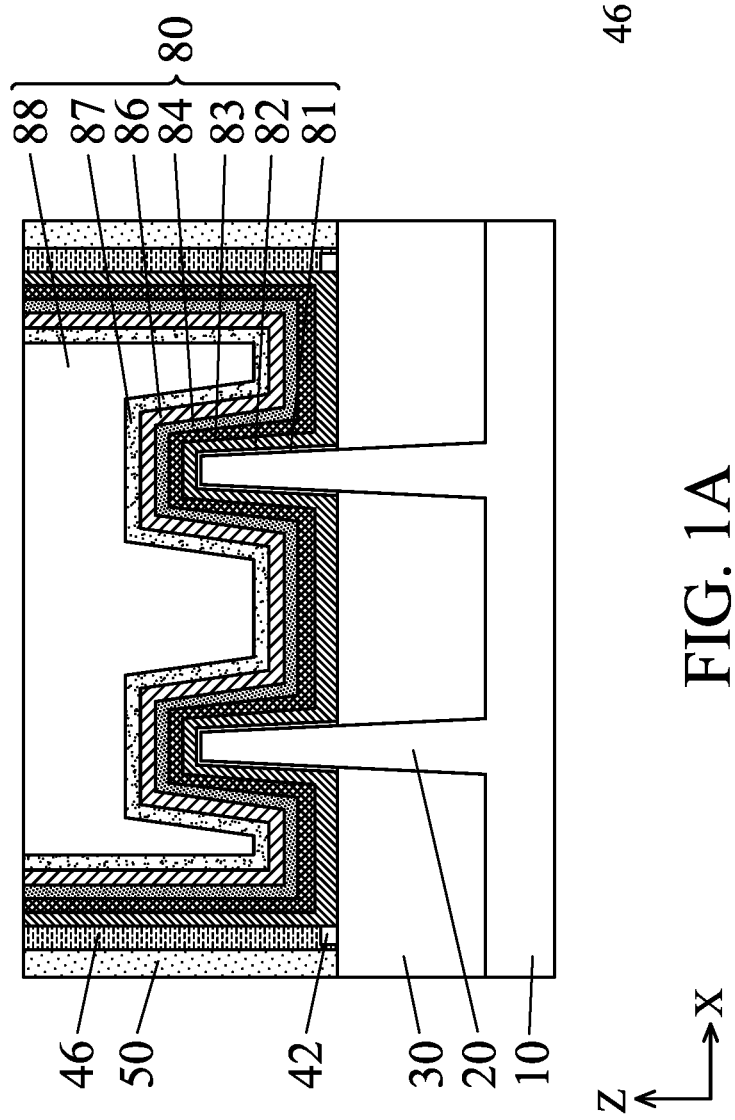
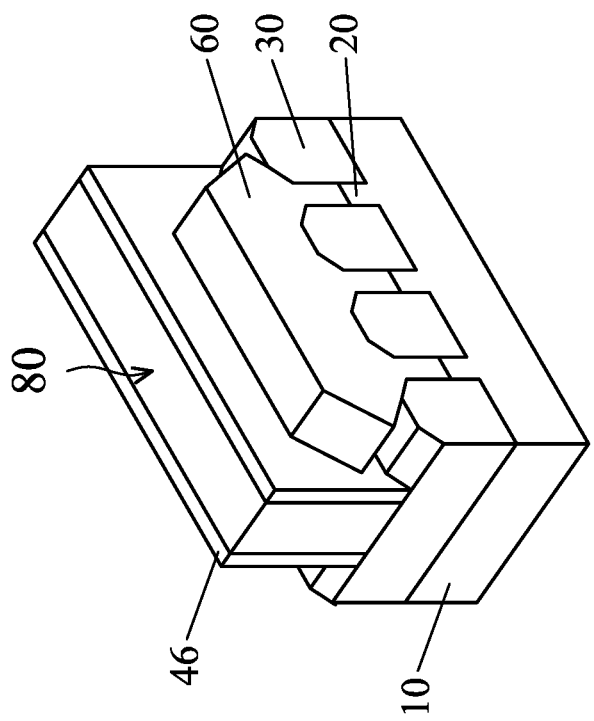
FIG. 1A
FIG. 1B

| | U-Low voltage | Low voltage | Standard voltage |
|---|---|---|---|
| NFET (Si Channel) | WF1 | WF2 | WF3 |
| PFET (SiGe Channel) | WF3 | WF2 | WF1 |

FIG. 4B

| | Vt1 | Vt2 | Vt3 | Vt4 | Vt5 | Vt6 | Vt7 | Vt8 |
|---|---|---|---|---|---|---|---|---|
| NFET | WF1 822 | WF1 823 | WF2 821 | WF2 822 | WF2 823 | WF3 821 | WF3 822 | WF3 823 |
| PFET | WF3 823 | WF3 822 | WF3 821 | WF2 823 | WF2 822 | WF2 821 | WF1 823 | WF1 822 |

|Vt1| < |Vt2| < |Vt3| < |Vt4| < |Vt5| < |Vt6| < |Vt7| < |Vt8|

FIG. 4C

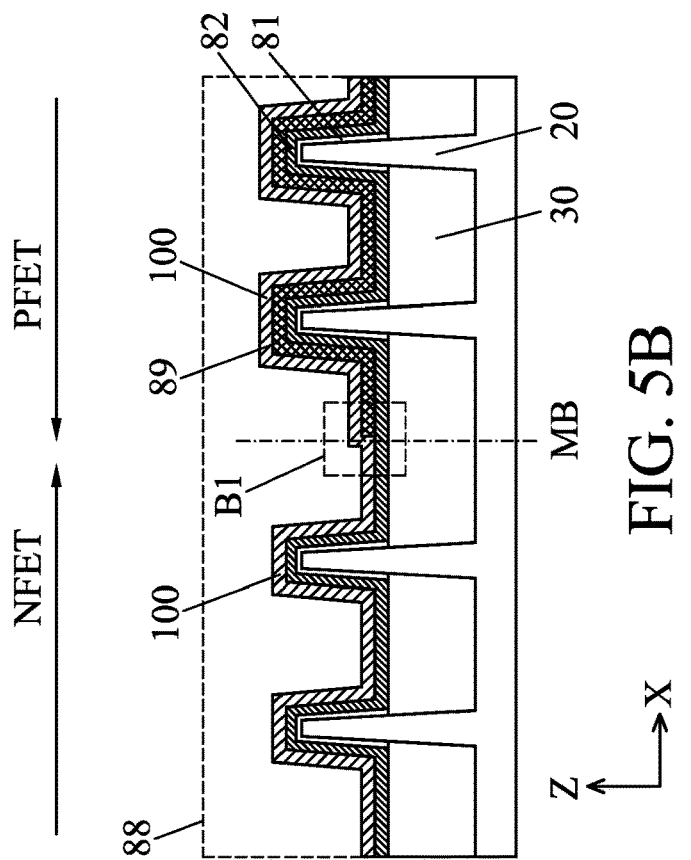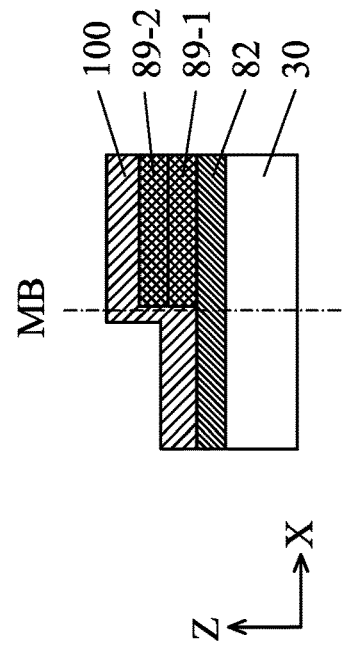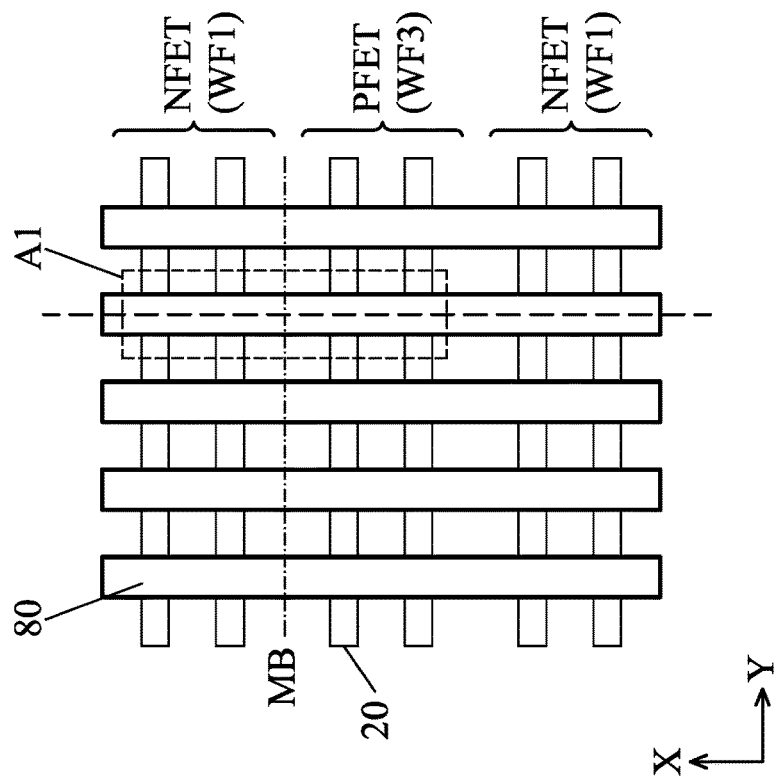

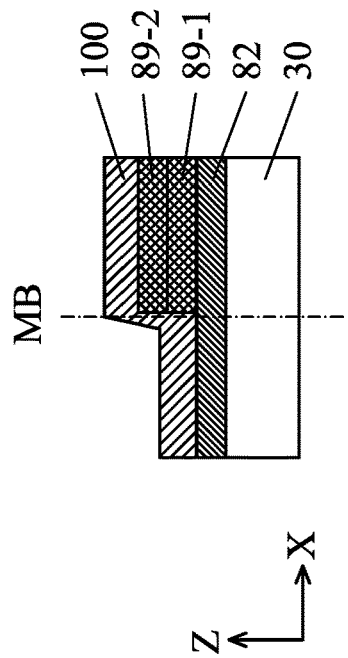
FIG. 6B
FIG. 6C
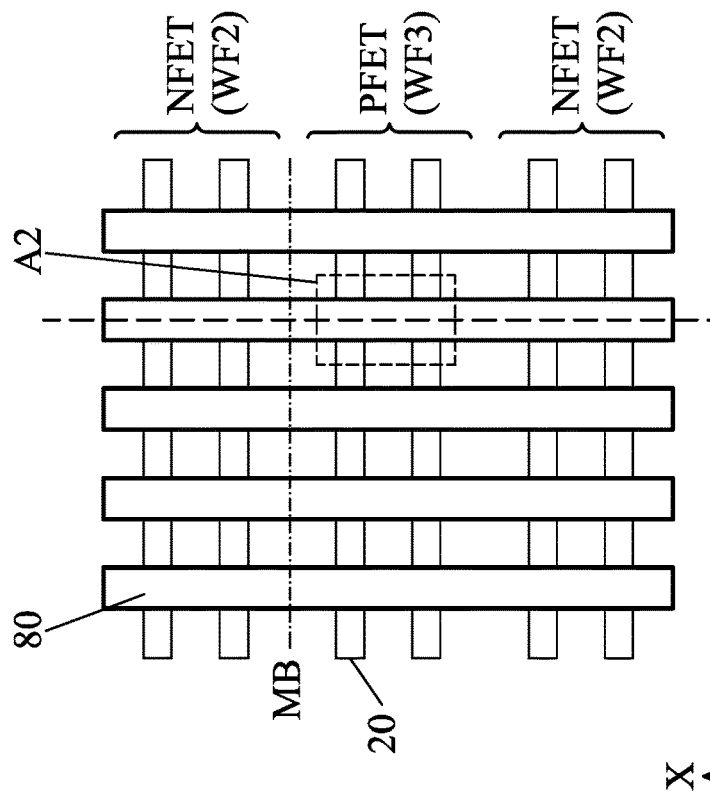
FIG. 6A

FIG. 8A

| N1 | N2 | N3 | P3 | P2 | P1 |
|---|---|---|---|---|---|
| 89-1 | 89-1 | 89-1 | 89-1 | 89-1 | 205 |
| 82 | 82 | 82 | 82 | 82 | 200 |
| 81N | 81N | 81N | 81P | 81P | 89-1 |
| | | | | | 82 |
| | | | | | 81P |

FIG. 8B

| N1 | N2 | N3 | P3 | P2 | P1 |
|---|---|---|---|---|---|
| 82 | 82 | 89-1 | 82 | 82 | 89-1 |
| 81N | 81N | 82 | 81 | 81 | 82 |
| | | 81N | | | 81 |

FIG. 8C

| N1 | N2 | N3 | P3 | P2 | P1 |
|---|---|---|---|---|---|
| 89-1 | 89-2 | 89-2 | 89-2 | 89-2 | 89-2 |
| 82 | 89-1 | 89-1 | 89-1 | 89-1 | 89-1 |
| 81N | 82 | 82 | 82 | 82 | 82 |
| | 81N | 81N | 81P | 81P | 81P |

FIG. 8D

| N1 | N2 | N3 | P3 | P2 | P1 |
|---|---|---|---|---|---|
| 82 | 89-2 | 89-2 | 82 | 89-2 | 89-2 |
| 81N | 82 | 82 | 81P | 82 | 82 |
| | 81N | 81N | | 81P | 81P |

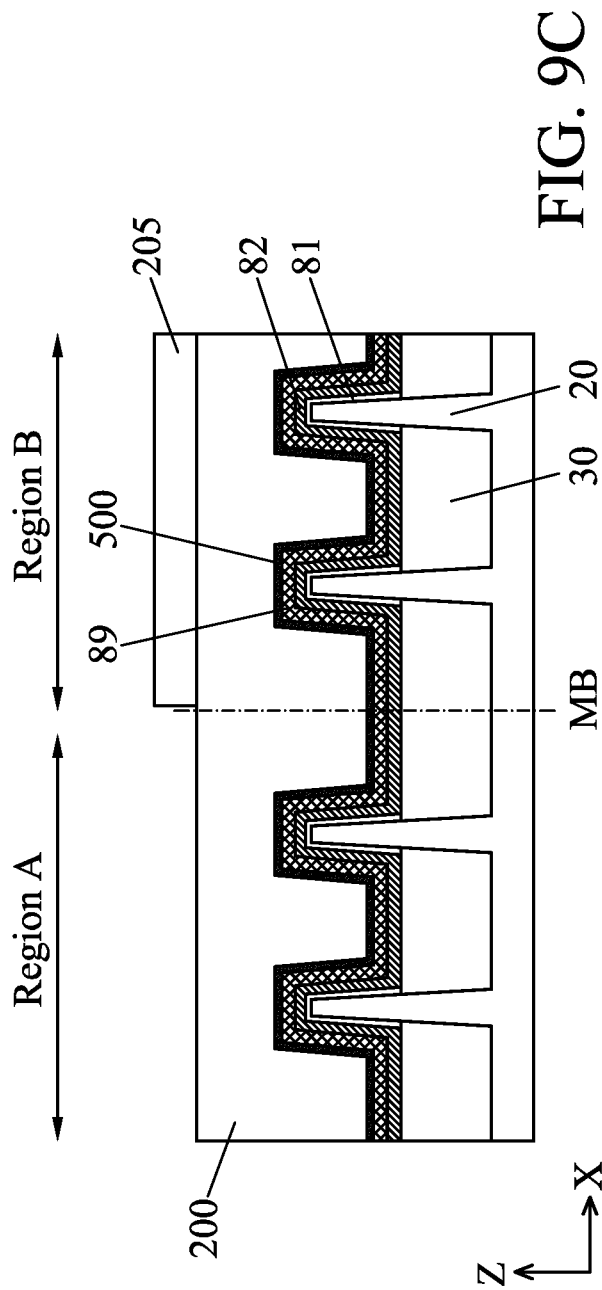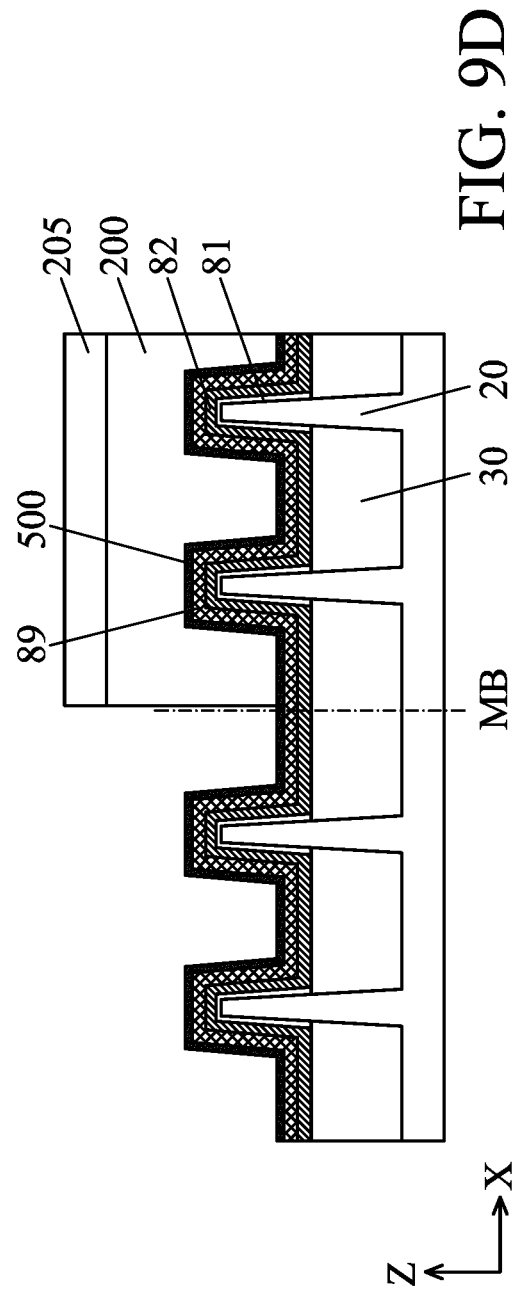

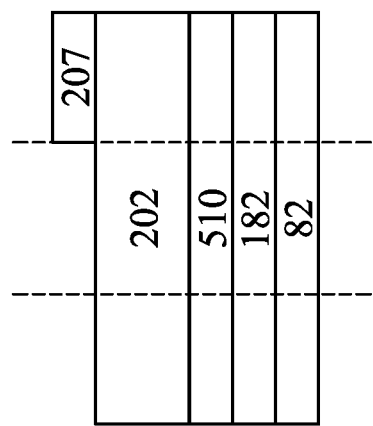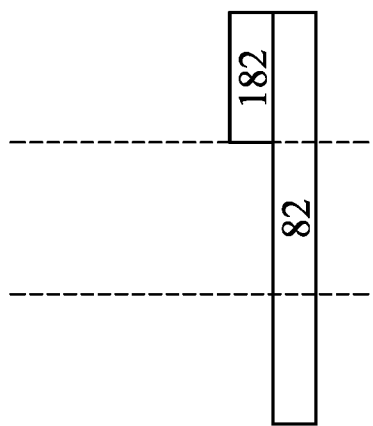
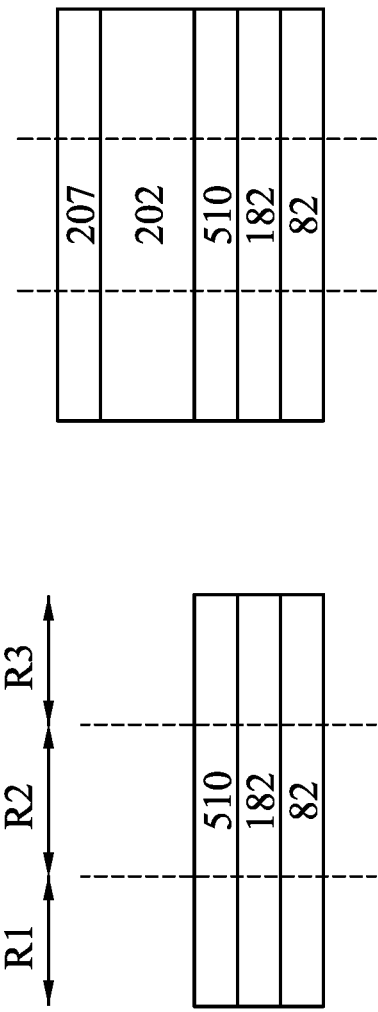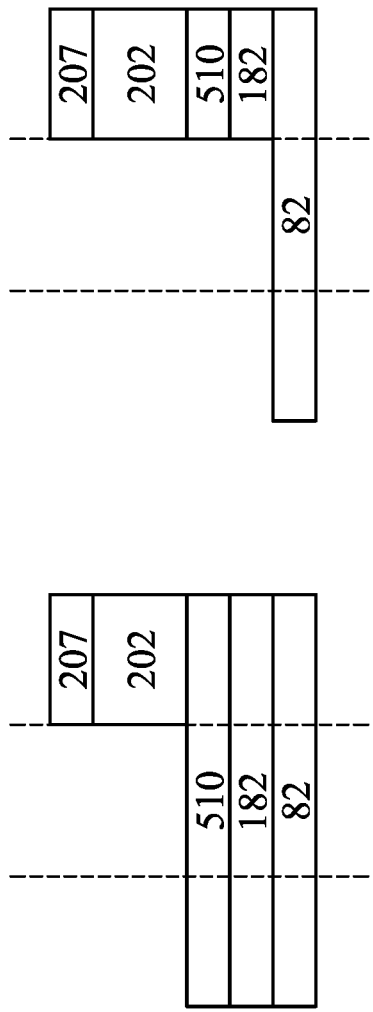

FIG. 12A

| N1' | N2' | N3' | P3' | P2' | P1' |
|---|---|---|---|---|---|
| 510 | 510 | 205 | 510 | 510 | 205 |
| 182 | 182 | 200 | 182 | 182 | 200 |
| 82 | 82 | 510 | 82 | 82 | 510 |
| 81N | 81N | 182 | 81P | 81P | 182 |
|  |  | 82 |  |  | 82 |
|  |  | 81N |  |  | 81P |

FIG. 12B

| N1' | N2' | N3' | P3' | P2' | P1' |
|---|---|---|---|---|---|
| 82 | 182 | 182 | 182 | 82 | 182 |
| 81N | 82 | 82 | 82 | 82 | 82 |
|  | 81N | 81N | 81 | 81 | 81 |

FIG. 12C

| N1' | N2' | N3' | P3' | P2' | P1' |
|---|---|---|---|---|---|
| 282 | 282 | 282 | 282 | 282 | 282 |
| 82 | 282 | 182 | 182 | 282 | 182 |
| 81N | 82 | 82 | 82 | 82 | 82 |
|  | 81N | 81N | 81P | 81P | 81P |

FIG. 12D

| N1' | N2' | N3' | P3' | P2' | P1' |
|---|---|---|---|---|---|
| 82 | 282 | 282 | 282 | 282 | 282 |
| 81N | 82 | 182 | 82 | 282 | 182 |
|  | 81N | 82 | 81P | 82 | 82 |
|  |  | 81N |  | 81P | 81P |

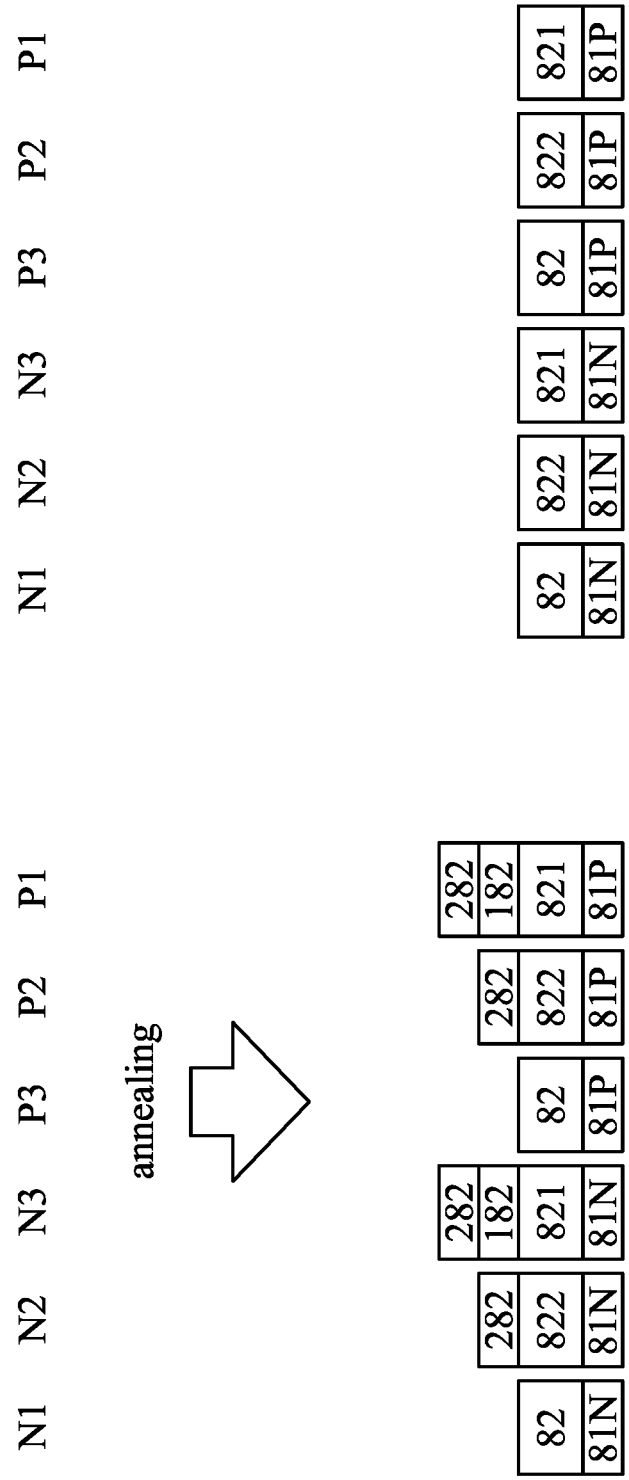

US 12,328,940 B2

METHOD OF MANUFACTURING SEMICONDUCTOR DEVICES AND SEMICONDUCTOR DEVICES

RELATED APPLICATION

This application is a divisional of U.S. patent application Ser. No. 16/934,916 filed Jul. 21, 2020, which claims priority to U.S. Provisional Patent Application No. 62/982,718 filed Feb. 27, 2020, the entire contents of each of which are incorporated herein by reference.

BACKGROUND

With increasing down-scaling of integrated circuits and increasingly demanding requirements of speed of integrated circuits, transistors need to have higher drive currents with increasingly smaller dimensions. Three dimensional field-Effect Transistors (FETs) were thus developed. Three dimensional (3D) FETs include vertical semiconductor nanostructures (such as fins, nanowires, nanosheets etc.) above a substrate. The semiconductor nanostructures are used to form source and drain regions, and channel regions between the source and drain regions. Shallow Trench Isolation (STI) regions are formed to define the semiconductor nanostructures. The 3D FETs also include gate stacks, which are formed on the sidewalls and the top surfaces of the semiconductor fins or on the all sides of nanowires, nanosheets. Since 3D FETs have a three-dimensional channel structure, ion implantation processes to the channel require extra care to reduce any geometrical effects. With increasing down-scaling of integrated circuits, the spacing between nearby devices is decreasing and the different threshold voltage devices are coming close together causing threshold voltage shift due to various process and/or structural issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows a cross section view and FIG. 1B shows a perspective view of a semiconductor device according to an embodiment of the present disclosure.

FIG. 4A shows gate structures of multiple FETs with different threshold voltages according to embodiments of the present disclosure. FIGS. 4B and 4C show various work function adjustment material layers and high-k gate dielectric layers for multiple FETs with different threshold voltages according to embodiments of the present disclosure.

FIG. 5A shows a plan view (layout) of a CMOS circuit, FIG. 5B shows a cross sectional view corresponding to area A1 of FIG. 5A and FIG. 5C shows an enlarged view of area B1 of FIG. 5B according to an embodiment of the present disclosure.

FIG. 6A shows a plan view (layout) of a CMOS circuit, FIG. 6B shows a cross sectional view corresponding to area A2 of FIG. 6A and FIG. 6C shows an enlarged view of area B2 of FIG. 6B according to an embodiment of the present disclosure.

FIGS. 8A, 8B, 8C, 8D, 8E and 8F show cross sectional views of various stages of a sequential manufacturing process of a semiconductor device according to embodiments of the present disclosure.

FIGS. 9A, 9B, 9C, 9D, 9E, 9F, 9G and 9H show cross sectional views of various stages of a sequential manufacturing process of a semiconductor device according to embodiments of the present disclosure.

FIGS. 10A, 10B, 10C, 10D, 10E, 10F, 10G, 10H and 10I show cross sectional views of various stages of a sequential manufacturing process of a semiconductor device according to embodiments of the present disclosure.

FIGS. 12A, 12B, 12C, 12D, 12E and 12F show cross sectional views of various stages of a sequential manufacturing process of a semiconductor device according to embodiments of the present disclosure.

DETAILED DESCRIPTION

Figure 2A:
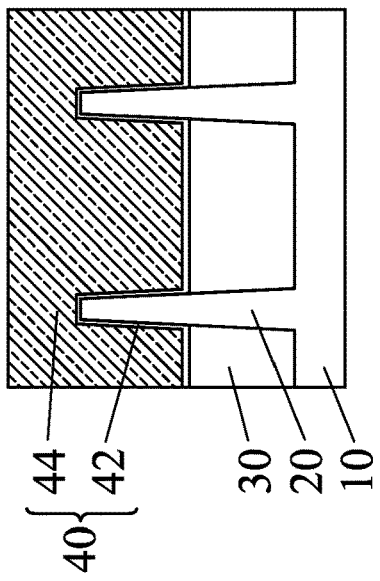
FIGS. 2A, 2B, 2C, 2D, 2E and 2F show cross sectional views of various stages of a sequential manufacturing process of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

Disclosed embodiments relate to a semiconductor device, in particular, a gate structure of a field effect transistor (FET) and its manufacturing method. The embodiments such as those disclosed herein are generally applicable not only to planar FETs but also to a fin FET (FinFET), a double-gate FET, a surround-gate FET, an omega-gate FET or a gate-all-around (GAA) FET (such as a lateral gate-all-around FET or a vertical gate-all-around FET), and/or nanowire transistors, nanosheet transistors, nano-forksheet transistors, nano-slab transistors or any suitable device having one or more work function adjustment material (WFM) layers in the gate structure.

With technology scaling down, semiconductor devices (e.g., transistors) are disposed much closer to each other, and the proximity effects (damage to nearby devices) are concerns. In FET structures, building multiple Vt devices with low Vt is very crucial for low power consumption and boosting device performance. Composition and thickness of metal gate films play a crucial role in defining the device work function. Multiple FETs having different threshold voltages can be realized by adjusting materials and/or thicknesses of one or more work function adjustment material layers (WFMs) disposed between a gate dielectric layer and a body metal gate electrode layer (e.g., a W layer). Further, a high-k dipole layer is used to form different Vt devices. In the formation of gate structures for different Vt devices (and for different conductivity type devices), various patterning operations are performed. In a lithography operation, a bottom antireflective layer (BARC) is used together a photo resist layer. However, a BARC layer, which is made of an organic material, may have a low adhesion strength to an underlying layer, such as a high-k dielectric or dipole layer or a work function adjustment material layer. Thus, at the metal boundary region, the wet chemicals used for an etching operation may penetrate into the interface between the BARC layer and the underlying layer, and cause damage on the underlying layer. Further, a plasma process to pattern and to remove the BARC layer also cause damage on the underlying layer. Further the wet chemical used during a cleaning process or the atmosphere moisture also cause damage on a high-k dipole layer and a WFM layer.

The present disclosure relates to the use of an adhesion layer over a work function adjustment metal layers and/or high-k dielectric layer to improve adhesion of a bottom antireflective layer.

FIG. 1A shows a cross section view of a semiconductor device according to an embodiment of the present disclosure.

In some embodiments, a semiconductor device includes a gate stack 80 disposed over a channel region of a fin structure 20. The gate stack 80 includes an interfacial layer 81, a gate dielectric layer 82, a first conductive layer 83 as a cap layer, a second conductive layer 84 as a first barrier layer, a work function adjustment material layer or a work function adjustment layer (a WFM layer) 86, a glue layer 87 and a body gate electrode layer 88 as shown in FIG. 1A. In some embodiments, the fin structure 20 is provided over a substrate 10 and protrudes from an isolation insulating layer 30. Further, gate sidewall spacers 46 are disposed on opposite side faces of the gate stack 80 and one or more dielectric layers 50 are formed to cover the gate sidewall spacers 46. In some embodiments, a piece of insulating material 42 is disposed between the gate sidewall spacer 46 and the isolation insulating layer 30. Further, as shown in FIG. 1B, source/drain epitaxial layers 60 are formed over recessed fin structures. Although FIG. 1A shows two fin structures and FIG. 1B shows three fin structures, the number of fin structures is not limited to those shown in FIGS. 1A and 1B.

In some embodiments, the fin structure (a channel region) is made of Si for an n-type FET and is made of SiGe for a p-type FET. A Ge concentration of SiGe is in a range from about 20 atomic % to 60 atomic % in some embodiments, and is in a range from about 30 atomic % to 50 atomic % in other embodiments. In some embodiments, the channel region of the n-type FET include Ge, of which amount is smaller than the SiGe channel of the p-type FET. In other embodiments, the channel regions of a p-type FET and an n-type FET are both made of Si or compound semiconductor.

In some embodiments, the first conductive layer 83 includes a metal nitride, such as WN, TaN, TiN and TiSiN. In some embodiments, TiN is used. The thickness of the first conductive layer 83 is in a range from about 0.3 nm to about 30 nm in some embodiments, and is in a range from about 0.5 nm to about 25 nm in other embodiments. In some embodiments, the first conductive layer 83 is crystalline having, e.g., columnar crystal grains. In some embodiments, the first conductive layer 83 is not formed. In some embodiments, the first conductive layer 83 is formed and then removed with after annealing operation with a wet etching process.

In some embodiments, the second conductive layer 84 includes a metal nitride, such as WN, TaN, TiN and TiSiN. In some embodiments, TaN is used. The thickness of the second conductive layer 84 is in a range from about 0.3 nm to about 30 nm in some embodiments, and is in a range from about 0.5 nm to about 25 nm in other embodiments. In some embodiments, the second conductive layer 84 functions as a barrier layer or an etch stop layer. In some embodiments, the second conductive layer 84 is thinner than the first conductive layer 83. In some embodiments, the second conductive layer 84 is not formed.

In some embodiments, the WFM layer 86 is made of a conductive material such as a single layer of TiN, WN, WCN, Ru, W, TaAlC, TiC, TaAl, TaC, Co, Al, TiAl, or TiAlC, or a multilayer of two or more of these materials. For an n-type FET having a Si channel, an aluminum containing layer, such as TiAl, TiAlC, TaAl and/or TaAlC and optionally one or more of TaN, TiN, WN, TiC, WCN, MoN and/or Co formed thereunder is used. For a p-type FET having a SiGe channel, one or more of TaN, TiN, WN, TiC, WCN, MoN and/or Co and one or more of TiAl, TiAlC, TaAl and TaAlC formed thereon is used.

In some embodiments, the glue layer 87 is made of one or more of TiN, Ti, and Co. In some embodiments, the body gate electrode layer 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

As set forth above, the first conductive layer 83 and the second conductive layer 84 are not formed in some embodiments. In such a case, one or more WFM layers are formed directly on the gate dielectric layer 82.

FIGS. 2A-3F show cross sectional views of various stages of a sequential manufacturing process of the semiconductor device according to an embodiment of the present disclosure. FIG. 3G shows a process flow of manufacturing a semiconductor device according to an embodiment of the present disclosure. It is understood that in the sequential manufacturing process, one or more additional operations can be provided before, during, and after the stages shown in FIGS. 2A-3F, and some of the operations described below can be replaced or eliminated for additional embodiments of the method. The order of the operations/processes may be interchangeable.

As shown in FIG. 2A, one or more fin structures 20 are fabricated over a substrate 10. The substrate 10 is, for example, a p-type silicon substrate with an impurity concentration in a range of about $1\times10^{15}$ cm$^{-3}$ to about $1\times10^{18}$ cm$^{-3}$. In other embodiments, the substrate 10 is an n-type silicon substrate with an impurity concentration in a range of about $1\times10^{15}$ cm$^{-3}$ to about $1\times10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

In some embodiments, a part of the substrate 10 for p-type FETs are recessed by etching and a SiGe layer is formed over the recesses. FIGS. 2A-3F show the case of an n-FET, but most of the fabrication process is substantially the same for a p-type FET.

The fin structures 20 can be patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and is patterned using a photolithography process. Spacers are formed alongside the patterned sacrificial layer using a self-aligned process. The sacrificial layer is then removed, and the remaining spacers may then be used to pattern the fin structures 20.

As shown in FIG. 2A, two fin structures 20 extending in the Y direction are disposed adjacent to each other in the X direction. However, the number of the fin structures is not limited to two. The numbers may be one, three, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 15 nm in other embodiments. One skilled in the art will realize, however, that the dimensions and values recited throughout the descriptions are merely examples, and may be changed to suit different scales of integrated circuits.

Figure 2B:
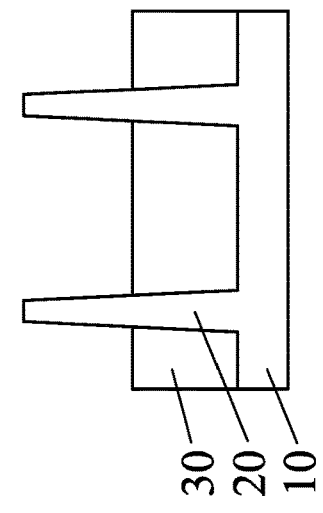

After the fin structures 20 are formed, an isolation insulating layer 30 is formed over the fin structures 20, as shown in FIG. 2B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (e.g., the pad oxide layer and the silicon nitride mask layer formed on the pad oxide layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 2B.

In certain embodiments, the partial removing of the isolation insulating layer 30 is performed using a wet etching process, for example, by dipping the substrate in hydrofluoric acid (HF). In another embodiment, the partial removing of the isolation insulating layer 30 is performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 2C:
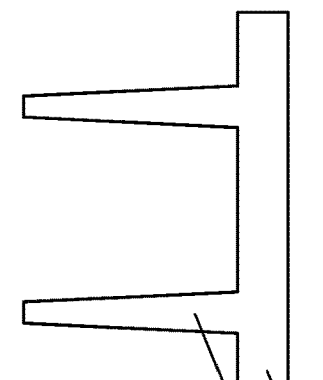

Then, a dummy gate structure 40 is formed over part of the fin structures 20 as shown in FIG. 2C.

A dielectric layer and a poly silicon layer are formed over the isolation insulating layer 30 and the exposed fin structures 20, and then patterning operations are performed so as to obtain a dummy gate structure including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 can be silicon oxide formed by CVD, PVD, ALD, e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer is in a range of about 1 nm to about 5 nm.

In some embodiments, the dummy gate electrode layer 44 is doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one of more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Figure 2D:
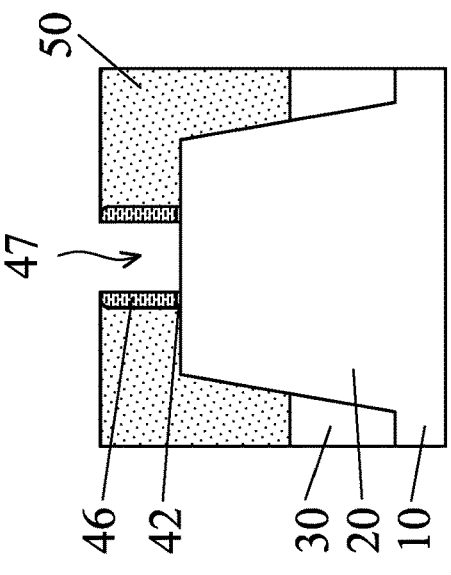

Further, as shown in FIGS. 2C and 2D, sidewall spacers 46 are formed on opposite side faces of the dummy gate structures 40. FIG. 2D is a cross section in the y-z plane. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming gate sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers 60 (see, FIG. 1B) are formed in the source/drain recess. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe or Ge doped with B for a p-type FinFET. An amount of P (phosphorus) in the first epitaxial layer is in a range from about $1\times10^{18}$ atoms/cm$^3$ to about $1\times10^{20}$ atoms/cm$^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range about $1\times10^{20}$ atoms/cm$^3$ to about $2\times10^{20}$ atoms/cm$^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer includes a SiP epitaxial layer in some embodiments. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/cm$^3$ to about $1\times10^{21}$ atoms/cm$^3$ in some embodiments. When the third epitaxial layer is SiGe, an amount of Ge is less than about 20 atomic % in some embodiments, and is about 1 atomic % to about 18 atomic % in other embodiments.

In at least one embodiment, the epitaxial layers 60 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as SiH$_4$, Si$_2$H$_6$, or Si$_3$H$_8$; germanium source gas such as GeH$_4$, or Ge$_2$H$_6$; carbon source gas such as CH$_4$ or SiH$_3$CH$_3$ and phosphorus source gas such as PH$_3$.

Then, as shown in FIGS. 2C and 2D, an interlayer dielectric (ILD) layer 50 is formed over the S/D epitaxial layer 60 and the dummy gate structure 40. The materials for the ILD layer 50 include compounds comprising Si, O, C and/or H, such as silicon oxide, SiCOH and SiOC. Organic materials, such as polymers, may be used for the ILD layer 50.

After the ILD layer 50 is formed, a planarization operation, such as CMP, is performed, so that the top portion of the dummy gate electrode layer 44 is exposed, as shown in FIGS. 2C and 2D. In some embodiments, before the ILD layer 50 is formed, a contact etch stop layer, such as a silicon nitride layer or a silicon oxynitride layer, is formed.

Figure 2E:
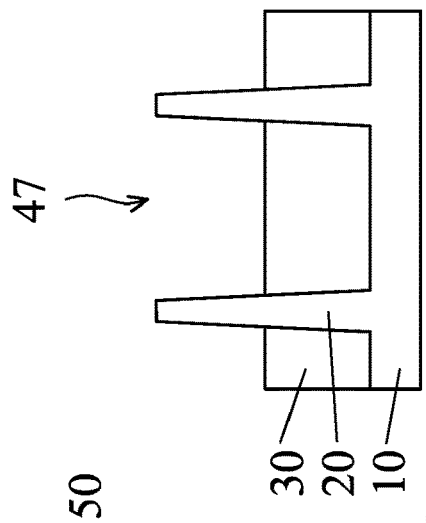
Figure 2F:
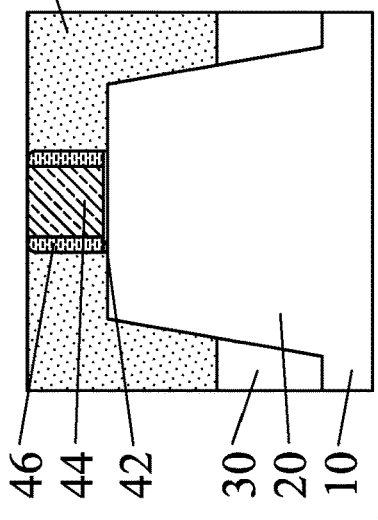

Then, the dummy gate electrode layer 44 and the dummy gate dielectric layer 42 are removed, thereby forming a gate space 47 as shown in FIGS. 2E and 2F. FIG. 2F is a cross section in the y-z plane. The dummy gate structures can be removed using plasma dry etching and/or wet etching. When the dummy gate electrode layer 44 is polysilicon and the ILD layer 40 is silicon oxide, a wet etchant such as a TMAH solution can be used to selectively remove the dummy gate electrode layer 44. The dummy gate dielectric layer 42 is thereafter removed using plasma dry etching and/or wet etching.

Figure 3A:
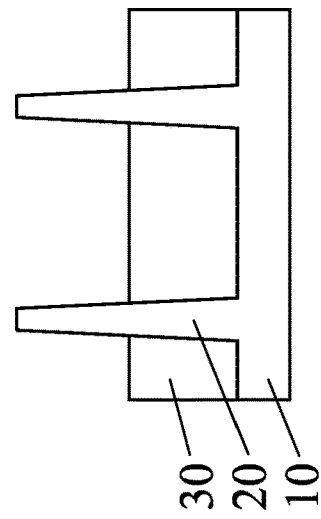
FIGS. 3A, 3B, 3C, 3D, 3E and 3F show cross sectional views of various stages of a sequential manufacturing process of a semiconductor device according to an embodiment of the present disclosure.

FIG. 3A shows the structure after the channel region of the fin structures 20 are exposed in the gate space 47. In FIGS. 3A-3F, the sidewall spacers 46 and the ILD layer 50 are omitted.

Figure 3B:
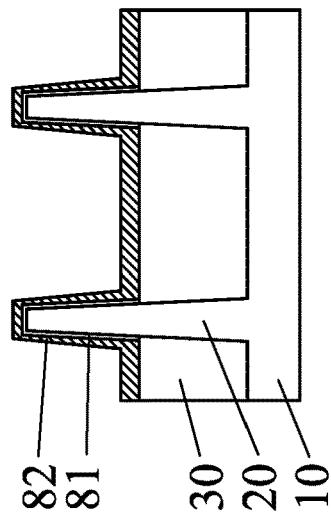
Figure 3C:
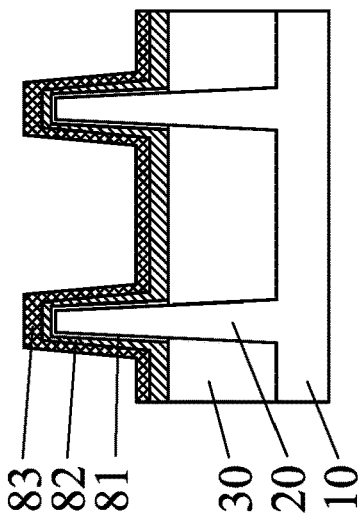
Figure 3D:
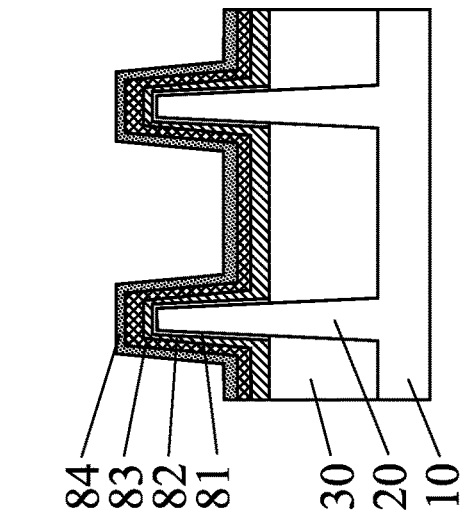
Figure 3E:
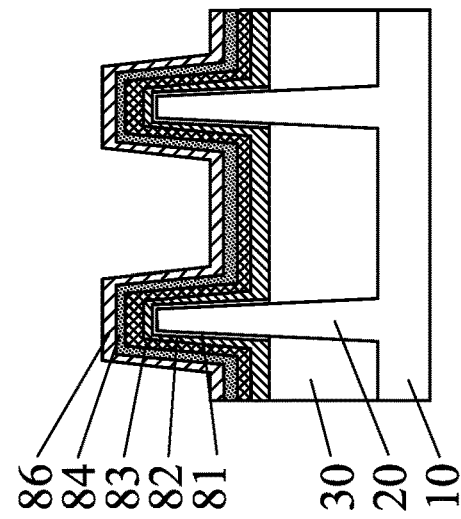
Figure 3F:
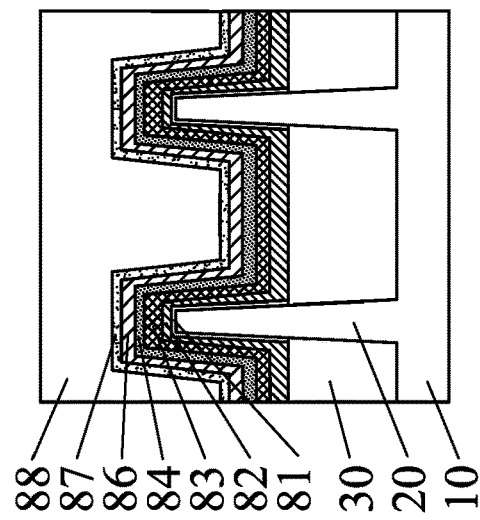
Figure 3G:
FIG. 3G shows a process flow of manufacturing a semiconductor device according to an embodiment of the present disclosure.

As shown in FIG. 3B, at S301 of FIG. 3G, an interfacial layer 81 is formed on the fin structure 20 and, at S303 of FIG. 3G, a gate dielectric layer 82 is formed on the interfacial layer 81. In some embodiments, the interfacial layer is formed by using chemical oxidation. In some embodiments, the interfacial layer 81 includes one of silicon oxide, silicon nitride and silicon-germanium oxide. In some embodiments, when the channel is made of Si, the interfacial layer is a silicon oxide layer 81N, and when the channel is made of SiGe, the interfacial layer is silicon-germanium oxide layer 81P (see, FIG. 4A). The thickness of the interfacial layer 81 is in a range from about 0.6 nm to about 2 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 30 nm in one embodiment. In some embodiments, one or more high-k dipole layers as described below are formed on the gate dielectric layer 82. In some embodiments, an annealing operation is performed after the dipole layer is formed. Further, in some embodiments, a cleaning operation to remove residues of the dipole layer generated in patterning operations of the dipole layer.

Then, as shown in FIG. 3C, at S305 of FIG. 3G, a first conductive layer 83 is formed. The first conductive layer 83 can be formed by CVD, ALD or any suitable method in some embodiments. In some embodiments, the first conductive layer 83 is made of TiN or TiSiN. In some embodiments, no first conductive layer 83 is formed.

In some embodiments, at S307 of FIG. 3G, after the first conductive layer 83 is formed, a first annealing operation is performed for about 1 nsec (spike annealing, such as a laser annealing and/or isothermal annealing) to about 360 sec at a temperature of about 600° C. to about 950° C. in some embodiments. The first annealing can help to densify the gate dielectric layer 82 and to incorporate nitrogen into the gate dielectric layer 82. Nitrogen helps to passivate oxygen vacancies, reduces leakage and improves device reliability. The first annealing can also help to form a stable intermixing layer, which helps to provide a stable platform for subsequent metal gate film deposition onto the dielectric layer. When the temperature is too high, the first annealing may cause crystallization and grain boundary formation in the high-k gate dielectric layer 82, which impacts on leakage performance and regrowth of the interfacial layer 81, which slows down device speed. In contrast, when the temperature is too low, the first annealing may not provide sufficient densification and/or nitridation in the high-k gate dielectric layer and cause device instability/variations during subsequent metal gate deposition processes. In some embodiments, when no first conductive layer 83 is formed, no annealing operation at this stage is performed. In some embodiments, the first conductive layer 83 is formed and then an annealing operation is performed; thereafter the first conductive layer 83 is removed with a wet etching process.

In some embodiments, the stacked structure including the interfacial layer 81, the gate dielectric layer 82 and the first conductive layer 83 is soaked in a fluorine containing gas (e.g., $F_2$ and/or $NF_3$) for about 4 sec to about 15 min at a temperature of about room temp (25° C.) to about 550° C. in some embodiments. Incorporation of fluorine helps to improve the work function adjustment, decrease Vt of a PMOS device, passivate oxygen vacancies in the gate dielectric layer 82, reduce leakage and reduce dangling bonds in the gate dielectric layer. Thereafter, a capping layer made of, for example a crystalline, polycrystalline or amorphous Si, is formed over the first conductive layer 83, and a second annealing operation is performed for about 1 nsec (spike annealing, such as a laser annealing) to about 360 sec at a temperature of about 550° C. to about 1300° C. in some embodiments. In some embodiments, the annealing temperature is from 900° C. to 1100° C. This results in the diffusion of the fluorine into the capping layer, the first conductive layer 83 and the gate dielectric layer 82 in some embodiments. After the second annealing operation, the capping layer is removed. The second annealing with the Si capping layer also helps to improve the quality of the gate dielectric layer 82. A gate dielectric layer, such as a high-k dielectric layer, is formed at a relatively low temperature to avoid crystallization and grain boundary formation, while metal gate films are deposited at relatively higher temperatures. Accordingly, it is desirable to make the high-k dielectric layer more thermally stable before the metal gate deposition. The second annealing with the capping layer at the temperature ranges as set forth above can densify the high-k dielectric layer, and make it thermally stable, without any thermal oxide inversion during the metal gate deposition. The second annealing also helps to thermally in-diffuse the fluorine from the outer layers (e.g., the capping layer) into the first conductive layer 83, the gate dielectric layer 82 and the interfacial layer 81. The capping layer is used to protect the gate dielectric layer 82 and the first conductive layer 83 from undesirable oxidation damage and to isolate these films from the annealing atmosphere. After thermal stabilization of the gate dielectric layer, the capping layer is no longer required in the final device structure and therefore it is removed.

In other embodiments, no fluorine soaking operation accompanying formation of a Si capping layer and a second annealing operation is performed.

Subsequently, at S309 of FIG. 3G, a second conductive layer, as a first barrier layer 84 is formed, and then at S311 of FIG. 3G, one or more WFM layers 86 are formed. A metal gate layer including a glue layer 87 and a body metal layer (gate electrode layer) 88 is formed above the work function adjustment layer 86, at S313 of FIG. 3G.

In some embodiments, the second conductive layer 84 is made of TaN and serves as an etch stop barrier layer. The second conductive layer 84 acts as a wet etching stop layer during patterning of p-type and n-type WFM layers subsequently formed to form multiple Vt devices. In some embodiments, no second conductive layer 84 is formed.

The work function adjustment material (WFM) layer 86 can be formed by ALD, PVD, CVD, e-beam evaporation, or other suitable process. Further, the WFM layer can be formed separately for the n-channel FET and the p-channel FET which may use different metal layers. The gate electrode layer (body metal layer) 88 and the glue layer 87 can be formed by CVD, ALD, electro-plating, or other suitable method. When the first and second conductive layers are not formed, the WFM layer 86 is directly formed on the gate dielectric layer 82. In some embodiments, the first conductive layer 83 is formed and removed after the annealing operation S307, thereafter second conductive layer is not formed and the WFM layer 86 is directly formed on the gate dielectric layer 82.

Figures 4A, 4B:
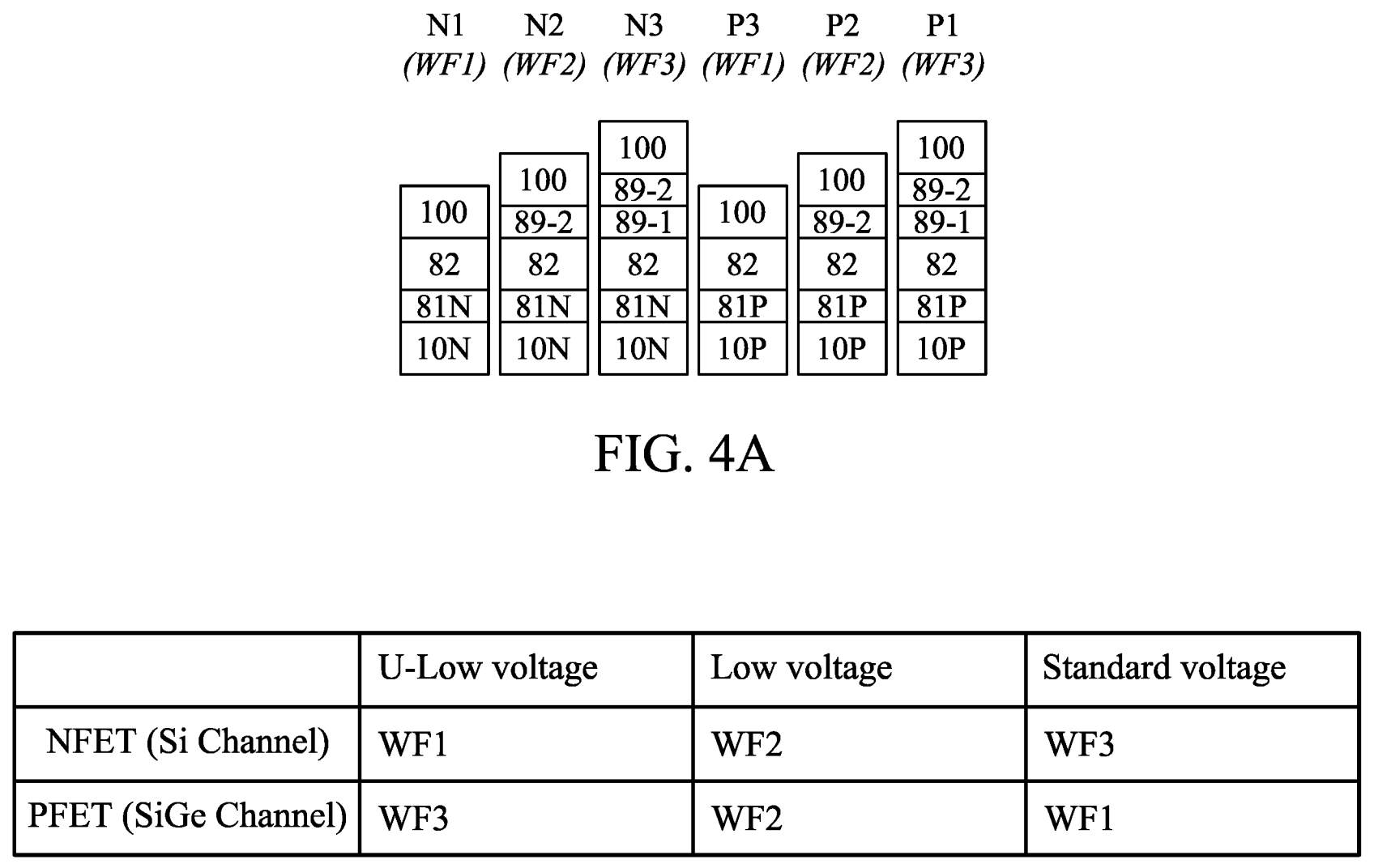

FIG. 4A shows a cross section view of gate structures for FETs with different threshold voltages according to an embodiment of the present disclosure. FIGS. 4B and 4C show various work function adjustment material layers for multiple FETs with different threshold voltages according to embodiments of the present disclosure.

In some embodiments, a semiconductor device includes a first n-type FET N1 having a WFM layer structure WF1, a second n-type FET N2 having a WFM layer structure WF2, a third n-type FET N3 having a WFM layer structure WF3, a first p-type FET P1 having the WFM layer structure WF3, a second p-type FET P2 having the WFM layer structure WF2, and a third p-type FET P3 having the WFM layer structure WF1. A threshold voltage of the first n-type FET N1 (ultra-low voltage FET) is smaller in an absolute value than a threshold voltage of the second n-type FET N2 (low-voltage FET) and the threshold voltage of the second n-type FET N2 is smaller in an absolute value than a threshold voltage of the third n-type FET N3 (standard voltage FET). Similarly, a threshold voltage of the first p-type FET P1 (ultra-low voltage FET) is smaller in an absolute value than a threshold voltage of the second p-type FET P2 (low voltage FET) and the threshold voltage of the second p-type FET P2 is smaller in an absolute value than a threshold voltage of the third p-type FET P3 (standard voltage FET). The threshold voltage in an absolute value of the first n-type FET N1 is designed to have the same threshold voltage in an absolute value of the first p-type FET P1, the threshold voltage in an absolute value of the second n-type FET N2 is designed to have the same threshold voltage in an absolute value of the second p-type FET P2, and the threshold voltage in an absolute value of the third n-type FET N3 is designed to have the same threshold voltage of the third p-type FET P3.

In some embodiments, the WFM layer structure WF1 includes a first WFM layer 100, the WFM layer structure WF2 includes, closer to the gate dielectric layer 82, a second WFM layer 89-2 and the first WFM layer 100, and the third WFM layer structure WF3 includes, closer to the gate dielectric layer 82, a third WFM layer 89-1, the second WFM layer 89-2 and the first WFM layer 100, as shown in FIG. 4A.

In FIG. 4B, the semiconductor device includes three different threshold voltage levels. In other embodiments, as shown in FIG. 4C, more than three, e.g., eight different threshold voltages are utilized for an n-type FET and a p-type FET, respectively. In FIG. 4C, not only the WFM layer structures but also configurations HK1, HK2 and HK3 of the gate dielectric layer 82 (e.g., material, thickness, etc.) are adjusted to obtain a desired threshold voltage. HK1, HK2, HK3 are composed of different materials such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof. In some embodiments, HK1, HK2 and HK3 are composed of a high-k dielectric with a different concentrations of rare-earth metal and/or Group-III dopants (such as, La, Al, Mg, Sc, Dy, Y, Ti, Lu, Sr etc.). In some embodiments, HK3 is composed of HfOx, HK2 is composed of HfLaOx (or HfYOx, HfLuOx, HfSrOx, HfScOx, HfDyOx) and HK1 is composed of HfLaOx (or HfYOx, HfLuOx, HfSrOx, HfScOx, HfDyOx), such that the amount of La (or Y, Lu, Sr, Sc, Dy) in HK1 is higher than that in HK2. In some embodiments, HK1 is composed of HfOx, HK2 is composed of HfAlOx (or HfZrOx, HfTiOx) and HK3 is composed of HfAlOx (or HfZrOx, HfTiOx), such that the amount of Al (or Zr, Ti) in HK3 is higher than that in HK2. In some embodiments, HK2 is composed of HfOx, HK1 is composed of HfLaOx (or HfYOx, HfLuOx, HfSrOx, HfScOx, HfDyOx) and HK3 is composed of HfAlOx (or HfZrOx, HfTiOx). The thicknesses of HK1, HK2 and HK3 are in the range from about 0.6 nm to about 30 nm in some embodiments. In some embodiments, more than three different high-k dielectric films are used.

In a CMOS device, a gate electrode is commonly used for (shared by) an n-type FET and p-type FET, and thus an n-type FET and p-type FET having substantially the same threshold voltage are selected. For example, a CMOS device having an ultra-low voltage FET includes the first n-type FET N1 and the first p-type FET P1. FIG. 5A shows a plan view (layout) of such a CMOS device.

As shown in FIG. 5A, a gate electrode 80 is disposed over one or more fin structures 20 (channel regions). In some embodiments, each of the n-type FET NFET and the p-type FET PFET includes two fin structures. In other embodiments, the number of the fin structures per FET is one or three or more (up to, e.g., 10). FIG. 5B shows a cross sectional view corresponding to area A1 of FIG. 5A and FIG. 5C shows an enlarged view of area B1 of FIG. 5B. In FIGS. 5B and 5C, the glue layer 87 and the body metal layer 88 (shown in broken line) are omitted.

As set forth above, the n-type FET NFET (e.g., N1) has the WFM layer structure WF1 having the first WFM layer 100 (only), and the p-type FET (e.g., P1) has the WFM layer structure WF3 having the second and third WFM layers (89-2 and 89-1, which are collectively referred to as 89 in FIG. 5B) and the first WFM layer 100. Accordingly, in the boundary MB of the n-type FET NFET and the p-type FET PFET, the second and third WFM layers 89 are discontinuously formed.

Similarly, in FIGS. 6A-6C, a CMOS device having a threshold voltage Vt3 includes an n-type FET with a WFM layer structure WF2 and a p-type FET with a WFM layer structure WF3 (see, FIG. 4C). FIG. 6B shows a cross sectional view corresponding to area A2 of FIG. 6A and FIG. 6C shows an enlarged view of area B2 of FIG. 6B. In FIGS. 6B and 6C, the glue layer 87 and the body metal layer 88 are omitted.

As shown in FIG. 6A, a gate electrode 80 is disposed over one or more fin structures 20 (channel regions). As set forth above, the n-type FET NFET has the WFM layer structure WF2 having the first WFM layer 100 and the second WFM layer 89-2, and the p-type FET has the WFM layer structure WF3 having the second and third WFM layers and the first WFM layer 100. Accordingly, at the boundary MB of the n-type FET NFET and the p-type FET PFET, the third WFM layer 89-1 is discontinuously formed.

In some embodiments, thicknesses of the gate dielectric layer 82 on the top of the fin structure (channel region) and on the side of the fin structure are substantially equal to each other (e.g., the difference is less than about 0.2 nm, or the variation of the thickness is about 0.5 % to about 5 %). In some embodiments, the compositions of the gate dielectric layer 82 on the top of the fin structure (channel region) and on the side of the fin structure are substantially equal to each other (e.g., a variation of a O/Hf ratio is about 0.5 % to about 5 %). In some embodiments, thicknesses of the conductive layers (e.g., WFM layer) on the top of the fin structure and on the side of the fin structure are substantially equal to each other (e.g., the difference is less than about 0.2 nm, or the variation of the thickness is about 0.5 % to about 5 %). In some embodiments, thicknesses of the conductive layers (e.g., WFM layer) on one side of the fin structure facing the metal boundary and on the other side of the fin structure are substantially equal to each other (e.g., the difference is less than about 0.2 nm, or the variation of the thickness is about 0.5 % to about 5 %). In some embodiments, thicknesses of the gate dielectric layer 82 on the fin structure and the sidewall at the metal boundary are substantially equal to each other (e.g., the difference is less than about 0.3 nm, or the variation of the thickness is about 0.5 % to about 7.5 %). In some embodiments, thicknesses of the conductive layers (e.g., WFM layer) on the fin structure and the sidewall at the metal boundary are substantially equal to each other (e.g., the difference is less than about 0.3 nm, or the variation of the thickness is about 0.5 % to about 7.5 %). In some embodiments, the surface roughness Ra of the conductive layers (e.g., WFM layer) is more than 0 nm and less than 0.8 nm and the surface roughness of the gate dielectric layer is more than 0 nm and less than about 0.7 nm.

In the formation of gate structures for different Vt devices (and for different conductivity type devices), various patterning operations are performed. In a lithography operation, a bottom antireflective layer (BARC) is used together a photo resist layer.

However, a BARC layer, which is made of an organic material, may have a low adhesion strength to an underlying layer, such as a dipole high-k dielectric or a work function adjustment material layer. Thus, at the metal boundary, the wet chemicals used for an etching operation may penetrate into the interface between the BARC layer and the underlying layer, and cause damage on the underlying layer, fin. Further, a plasma process to pattern and to remove the BARC layer also cause damage on the underlying layer and a fin structure. Further the wet chemical used during a cleaning process or the atmosphere moisture also cause damage on a high-k dipole layer and a WFM layer. In the present disclosure, as explained below, an adhesion enhancement layer is employed below the BARC layer.

Figure 7:
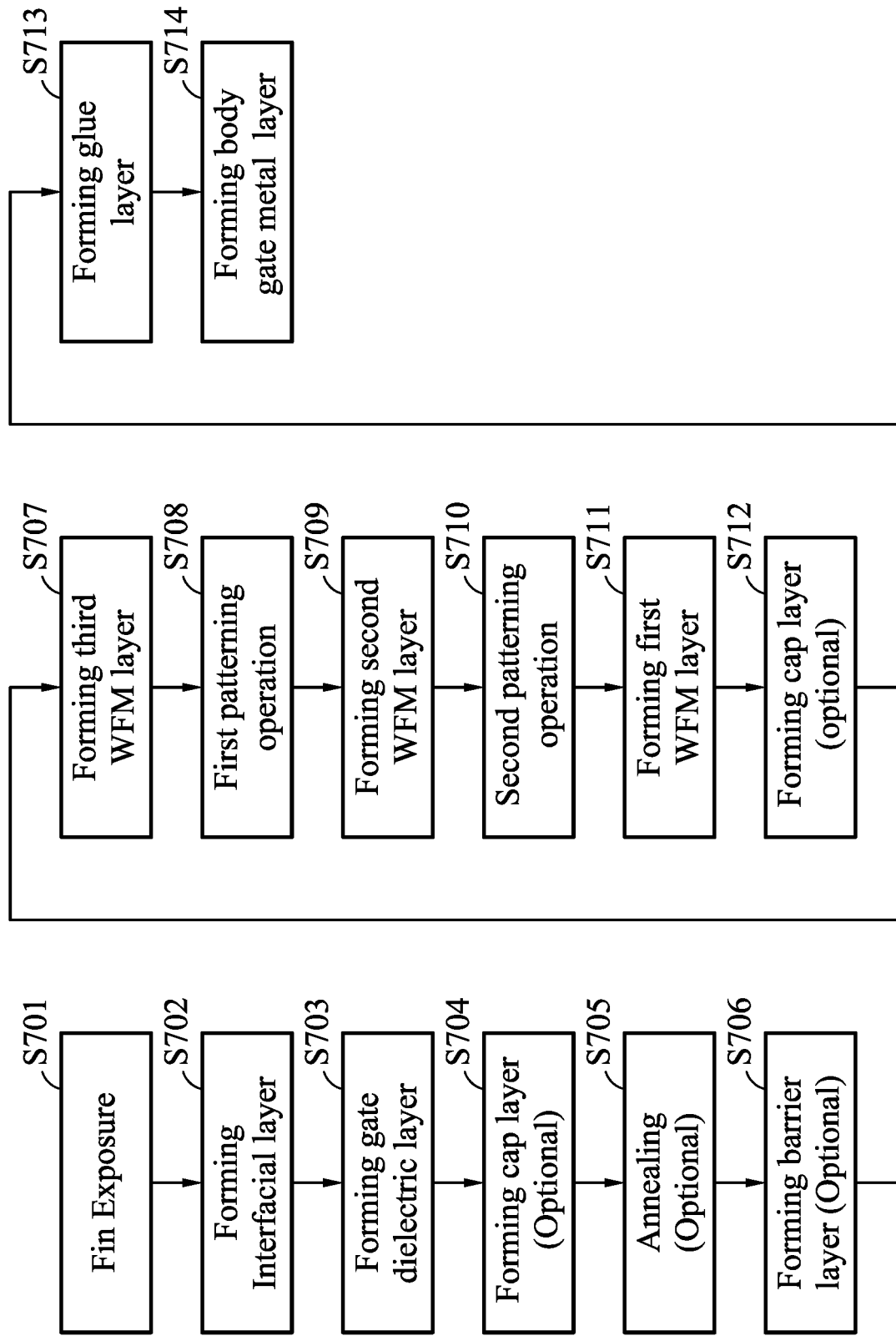
FIG. 7 shows a process flow of manufacturing a semiconductor device according to embodiments of the present disclosure.

FIG. 7 shows a process flow and FIGS. 8A-8F show cross sectional views of various stages of manufacturing the semiconductor device according to embodiments of the present disclosure. It is understood that in the sequential manufacturing process, one or more additional operations can be provided before, during, and after the stages shown in FIG. 7 and FIG. 8A-8F and some of the operations described below can be replaced or eliminated for additional embodiments of the method. The order of the operations/processes may be interchangeable. Materials, configurations, dimensions, processes and/or operations as described with respect to embodiments of FIGS. 1-8B can be employed in the following embodiments, and detailed description thereof may be omitted.

At S701 of FIG. 7, channel regions of fin structures are exposed for a first n-type FET N1, a second n-type FET N2, a third n-type FET N3, a first p-type FET P1, a second p-type FET P2 and a third p-type FET P3, respectively. In some embodiments, the channel regions for the n-type FETs are made of Si and the channel regions for the p-type FETs are made of SiGe.

At S702 of FIG. 7, interfacial layers 81N and 81P are formed on each of the channel regions 20 using chemical oxidation methods. In some embodiments, when the channel is made of Si, the interfacial layer is a silicon oxide layer 81N, and when the channel is made of SiGe, the interfacial layer is silicon-germanium oxide layer 81P. At S703 of FIG. 7, a gate dielectric layer (e.g., a high-k gate dielectric layer) 82 is formed on the interfacial layer 81N/81P. In some embodiments, different gate dielectric layers are formed at different FET devices. In some embodiments, at S704 of FIG. 7, a cap layer 83 is formed on the gate dielectric layer 82, followed by an annealing operation at S705, and at S706 of FIG. 7, a barrier layer 84 is formed on the cap layer 83.

In other embodiments, no cap layer and no barrier layer is formed. In other embodiments, a cap layer is formed, annealing is performed, and thereafter the cap layer is removed and no barrier layer is formed.

At S707 of FIG. 7, a third WFM layer 89-1 is formed on the gate dielectric layer 82 as shown in FIG. 8A. The third WFM layer 89-1 includes WN, WCN, W, Ru, TiN or TiSiN formed by, for example, CVD, ALD, PVD or any other suitable film formation methods. In some embodiments, a thickness of the third WFM layer 89-1 is in a range from about 0.5 nm to about 20 nm, and is in a range from about 1 nm to about 10 nm in other embodiments.

At S708 of FIG. 7, a first patterning operation is performed to remove the third WFM layer 89-1 from the regions for the first n-type FET N1, the second n-type FET N2, the second p-type FET P2 and the third p-type FET P3. In some embodiments, a bottom antireflective coating (BARC) layer 200 made of an organic material is formed on the third WFM layer 89-1, and a photo resist layer 205 is formed on the bottom antireflective coating layer 200, as shown in FIG. 8A. By using one or more lithography operations, the photo resist layer 205 is patterned, to expose the bottom antireflective coating layer 200 at the regions for the first and second n-type FETs and the second and third p-type FETs. Then, the exposed bottom antireflective coating layer 200 is removed by one or more plasma etching operations, to expose the third WFM layer 89-1 at the regions for the first and second n-type FETs and the second and third p-type FETs, as shown in FIG. 8A. The plasma etching operation utilizes a gas including $N_2$ and $H_2$, a gas including $O_2/Cl_2$ and/or an $O_2$ gas. In some embodiments, no bottom antireflective layer is used and a photo resist layer made of organic materials is formed on the third WFM layer 89-1.

Subsequently, the third WFM layer 89-1 in the first and second n-type FETs and the second and third p-type FETs is removed by an appropriate etching operation, as shown in FIG. 8B. In some embodiments, the etching operation includes a wet etching operation. The etching solution (etchant) includes an aqueous solution of HCl and $H_2O_2$, an aqueous solution of the combination of $NH_4OH$ and $H_2O_2$, an aqueous solution of the combination of HCl, $NH_4OH$ and $H_2O_2$, an aqueous solution of HF, $NH_4OH$ and $H_2O_2$ and/or an aqueous solution of $H_3PO_4$ and $H_2O_2$.

At S709 of FIG. 7, the second WFM layer 89-2 is formed on the gate dielectric layer 82 in the regions for the first and second n-type FETs and the second and third p-type FETs and on the third WFM layer 89-1 in the regions for the third n-type FET and the first p-type FET, as shown in FIG. 8C. The second WFM layer 89-2 includes WN, WCN, W, Ru, TiN or TiSiN formed by, for example, CVD, ALD, PVD or any other suitable film formation methods. In some embodiments, a thickness of the second WFM layer 89-2 is in a range from about 0.5 nm to about 20 nm, and is in a range from about 1 nm to about 10 nm in other embodiments. In some embodiments, the second and third WFM layers are made of the same material.

At S710 of FIG. 7, a second patterning operation is performed to remove the second WFM layer 89-2 from the regions for the first n-type FET N1 and the third p-type FET P3. The second patterning operation is substantially the same as or similar to the first patterning operation. FIG. 8D shows the structure after the second WFM layer 89-2 is removed from the regions for the first n-type FET N1 and the third p-type FET P3.

Figures 8E, 8F:
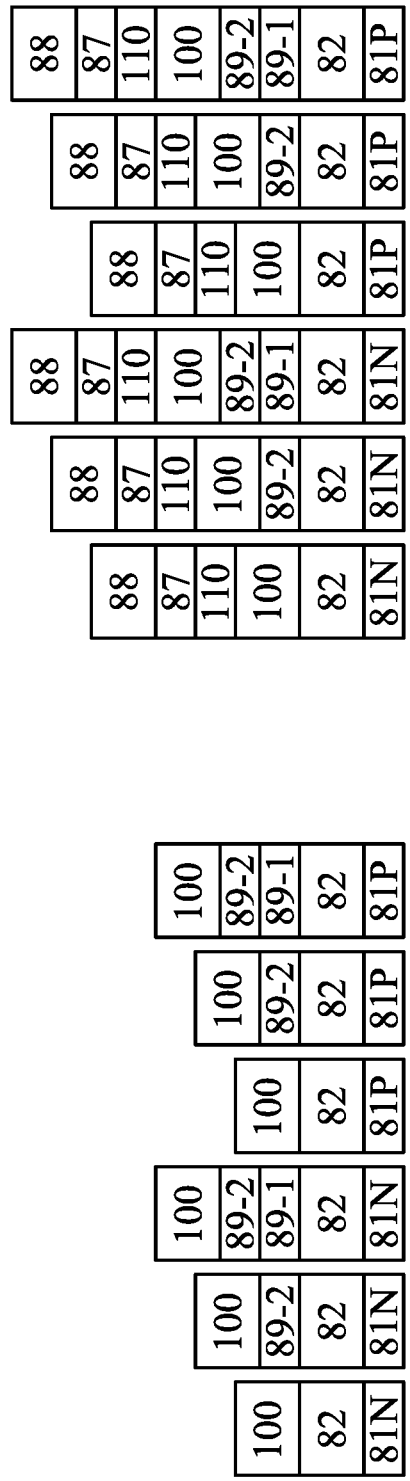

At S711 of FIG. 7, the first WFM layer 100 is formed on the gate dielectric layer 82 in the regions for the first n-type FET and the third p-type FET and on the second WFM layer 89-2 in the regions for the second and third n-type FETs and the first and second p-type FETs, as shown in FIG. 8E. The first WFM layer 100 is formed by, for example, ALD in some embodiments. In some embodiments, a thickness of the first WFM layer 100 is in a range from about 0.6 nm to about 40 nm, and is in a range from about 1 nm to about 20 nm in other embodiments. In some embodiments, the thickness of the first WFM layer 100 is greater than each of the second and third WFM layers.

At S712 of FIG. 7, a cap layer 110 is formed on the first WFM layer 100. In some embodiments, the cap layer 110 includes one or more metal nitride layers, such as TiN, TaN, TaTiN, WN, TiSiN, WCN and MoN. In other embodiments, no cap layer is formed.

At S713 of FIG. 7, a glue layer 87 is formed and then a body gate metal layer 88 is formed at S714 of FIG. 7, as shown in FIG. 8F. In some embodiments, the glue layer 87 is made of TiN, Ti and/or Co. In some embodiments, the body metal layer 88 is made of W, Al, Co, or any other suitable metal material.

As shown in FIGS. 8A-8F, a bottom antireflective coating (BARC) layer 200 is used to pattern an underlying layer, such as WFM layers. In some embodiments, the BARC layer 200 is made of an organic material, and has a low adhesion strength to the metal nitride layer, such as TiN, TaN, TaTiN, WN, TiSiN, WCN and MoN, or Ru used as the second and third WFM layers 89-1 and 89-2. Further, the BARC layer 200 may also have a low adhesion strength to TiAl, TiAlC, TaAl and TaAlC used as the first WFM layers 100. According to embodiments of the present disclosure, an adhesion enhancement layer is used under the BARC layer 200.

FIGS. 9A, 9B, 9C, 9D, 9E, 9F, 9G and 9H show cross sectional views of various stages of a sequential manufacturing process of a semiconductor device according to embodiments of the present disclosure. It is understood that in the sequential manufacturing process, one or more additional operations can be provided before, during, and after the stages shown in FIGS. 9A-9H and some of the operations described below can be replaced or eliminated for additional embodiments of the method. The order of the operations/processes may be interchangeable. Materials, configurations, dimensions, processes and/or operations as described with respect to embodiments of FIGS. 1-8F can be employed in the following embodiments, and detailed description thereof may be omitted.

In FIGS. 9A-9H, Region A and Region B are continuously provided across the metal boundary MB, and a common gate electrode is continuously formed over the n-type region and the p-type region by subsequent manufacturing operations. In some embodiments, Region A is for one or more n-type FETs and Region B is for one or more p-type FETs. In some embodiments, Region A is for one or more p-type FETs and Region B is for one or more n-type FETs.

Figure 9A:
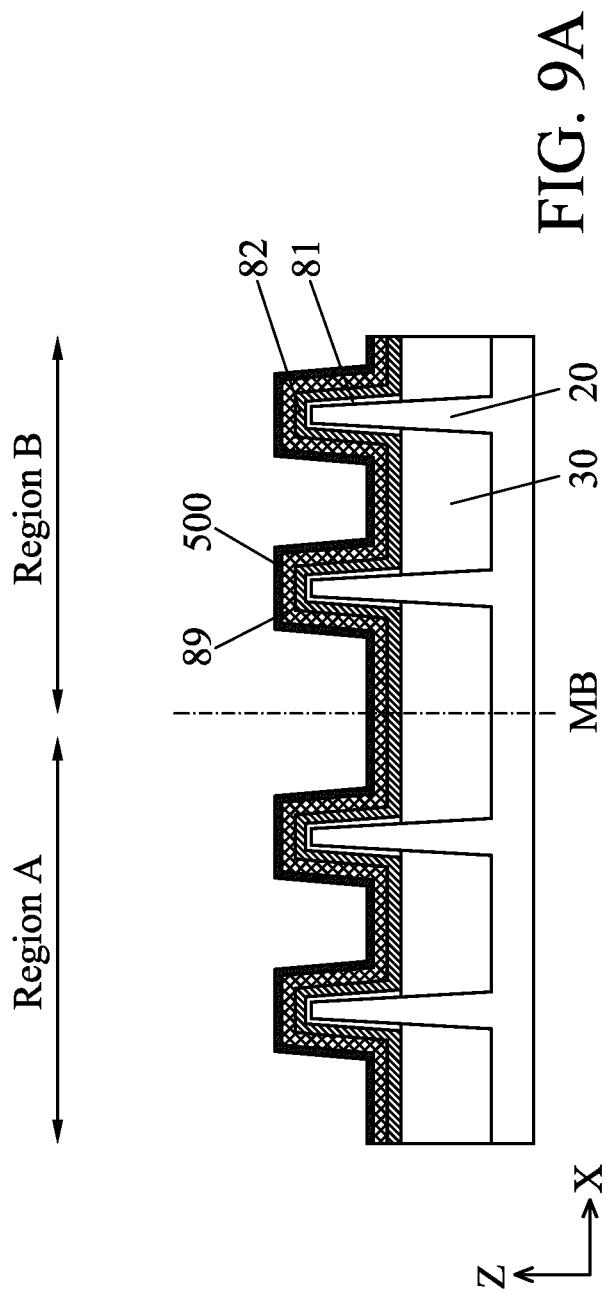

As shown in FIG. 9A, after the WFM layer 89 is formed over a gate dielectric layer 82, an adhesion enhancement layer 500 is formed in both Region A and Region B. In some embodiments, the adhesion enhancement layer 500 has a higher adhesion strength to the BARC layer than the WFM layer 89. In some embodiments, the adhesion enhancement layer 500 is a nitrogen rich layer having a higher nitrogen concentration than the WFM layer 89. In some embodiments, the WFM layer 89 is nitrogen free (contains no nitrogen) or contains nitrogen in an amount less than about 50 atomic %. In some embodiments, the adhesion enhancement layer 500 contains nitrogen in a range from 50 atomic % to 80 atomic % and in other embodiments, the adhesion enhancement layer 500 contains nitrogen in a range from 55 atomic % to 75 atomic %, In some embodiments, the adhesion enhancement layer 500 includes one or more of $TiN_x$ (where x is about 1.1 to 1.5), TiSiN, silicon nitride (SiN), AN, aluminum oxide ($AlO_x$ or $Al_2O_3$), cobalt oxide ($CoO_x$) or titanium oxide ($TiO_x$ or $TiO_2$) In some embodiments, the $TiN_x$ layer includes Ti in an amount of about 22 atomic % to about 35 atomic % and N in an amount of about 24 atomic % to about 51 atomic % (the rest is C and/or O). In some embodiments, the thickness of the adhesion enhancement layer 500 is in a range from about 0.2 nm to about 2 nm and is in a range from about 0.3 nm to about 1.5 nm in other embodiments. If the thickness exceeds this range, the adhesion enhancement layer 500 may affect work function and if the thickness is smaller than this range, adhesion enhancement may not be sufficient. In some embodiments, the adhesion enhancement layer 500 includes a combination of $Al_2O_3$ and AlN layers. In some embodiments, the adhesion enhancement layer 500 includes a combination of $Al_2O_3$ and TiN layers. In some embodiments, the adhesion enhancement layer 500 includes a HMDS, a Ti prime or a Si based organic compounds (e.g., diphenyl silanediol based compound). When the Si based organic material is used as the adhesion enhancement layer 500, the adhesion enhancement layer 500 is subsequently removed, but some silicon remain on the WFM layer at an amount of more than about 0.5 atomic % to less than about 11 atomic %, and also carbon remains in an amount of more than about 0.1% to less than about 1.5%, in some embodiments.

In some embodiments, the adhesion enhancement layer 500 is formed by CVD, ALD or any other suitable film formation methods. In other embodiments, the adhesion enhancement layer 500 is formed by nitridation of the underlying layer (WFM layer 89). In some embodiments, $N_2$ and/or $NH_3$ are used as a nitrogen source gas. In some embodiments, plasma is used. When the adhesion enhancement layer 500 is formed by nitridation of the underlying layer, the adhesion enhancement layer 500 has a higher nitrogen concentration than the underlying layer (WFM layer 89).

Figure 9B:
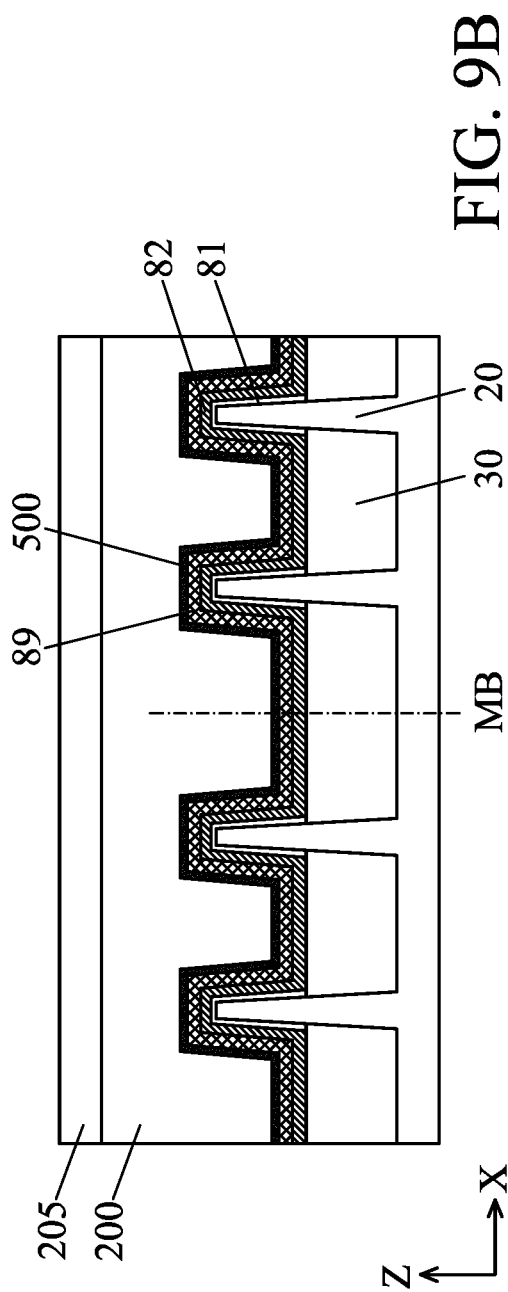

Then, as shown in FIG. 9B, a BARC layer 200 and a photo resist layer 205 are formed over the adhesion enhancement layer in both Region A and Region B. In some embodiments, the thickness of the BARC layer 200 is in a range from about 50 nm to about 2000 nm and is in a range from about 100 nm to about 200 nm in other embodiments.

Next, by using one or more lithography operations, the photo resist layer 205 is patterned and removed from Region A, as shown in FIG. 9C. Further, by using one or more etching operations (e.g., dry etching), the BARC layer 200 is patterned and removed from Region A by using the patterned photo resist layer 205 as an etching mask, as shown in FIG. 9D.

Figure 9E:
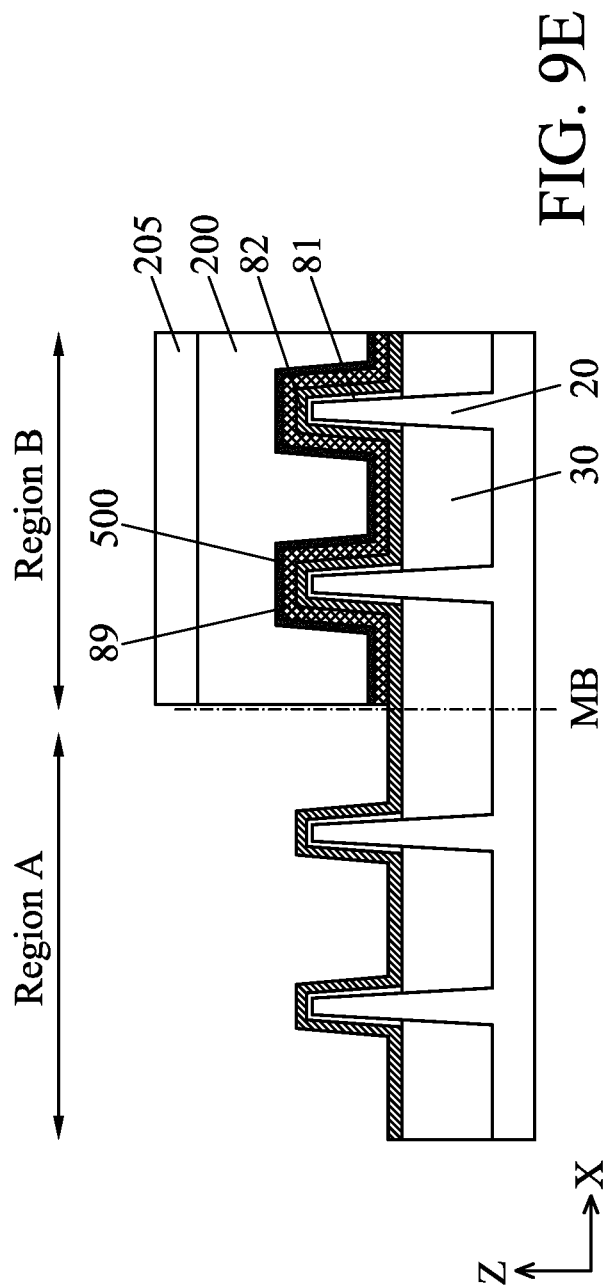

Then, as shown in FIG. 9E, the adhesion enhancement layer 500 and the WFM layer 89 are etched from Region A. In some embodiments, a wet etching is used to remove the adhesion enhancement layer 500 and the WFM layer 89 from Region A. Since the adhesion layer 500 improves adhesion strength between the WFM layer 89 and the BARC layer 200, at Region B a peeling off of the BARC layer is prevented, a wet chemical penetration via the interface below the BARC layer into Region B from across the metal boundary between Region A and Region B is prevented, and etching under the BARC layer 200 at Region-B is also suppressed. Subsequently, the photo resist layer 205 and the BARC layer 200 are removed from Region B. In some embodiments, a plasma ashing operation is performed to remove the BARC layer 200 from Region B and a wet ash cleaning using a mixture of one or more of water, HF, HCl and NH$_4$OH is performed to remove BARC residues. Since the adhesion enhancement layer 500 covers the WFM layer 89 at Region B, a loss of the WFM layer from the top of the fin structure is prevented. Due to good bonding the BARC layer 200 can have conformal deposition on the intricate structures and thus the gate dielectric layer and fin structure are effectively protected during the plasma etching and ashing processes. It should be noted that in the absence of adhesion enhancement layer 500, the adhesion between the BARC layer 200 and the WFM layer 89 may be insufficient at the Region B, and the wet chemicals (used during removal of the WFM layer 89 from Region A) may penetrate across the metal boundary MB into Region B through gaps at this poorly bonded BARC-WFM layer interface, and may cause unnecessary damage or etching of the WFM layer 89 from Region B.

Figure 9F:
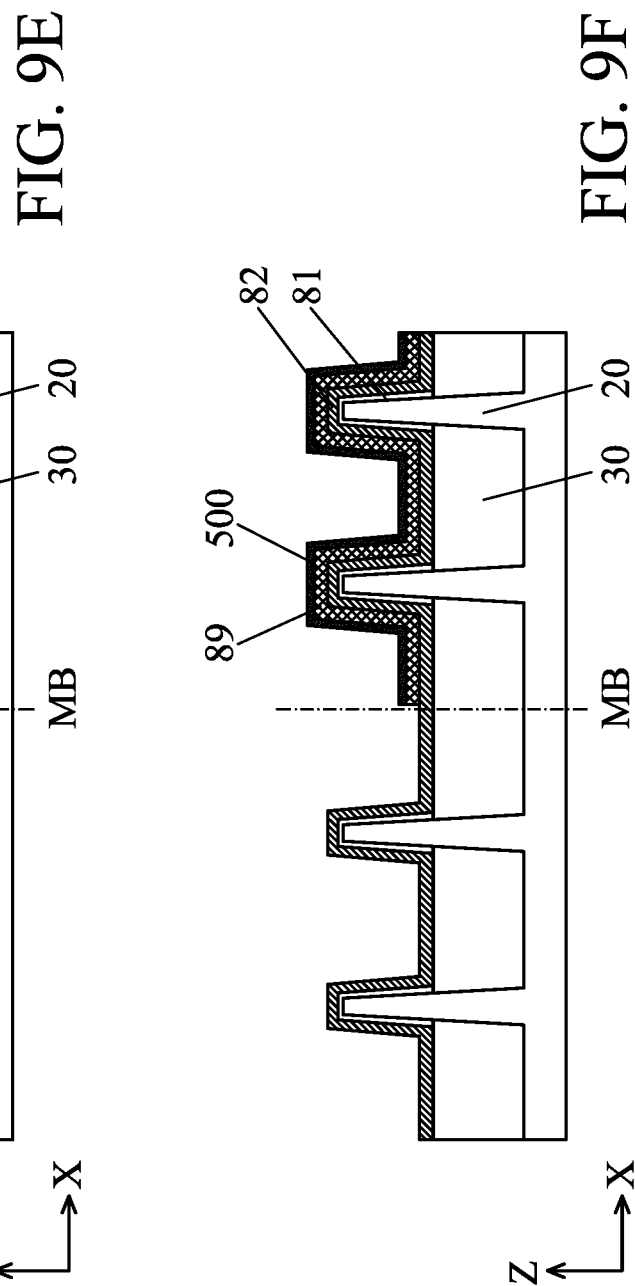
Figure 9G:
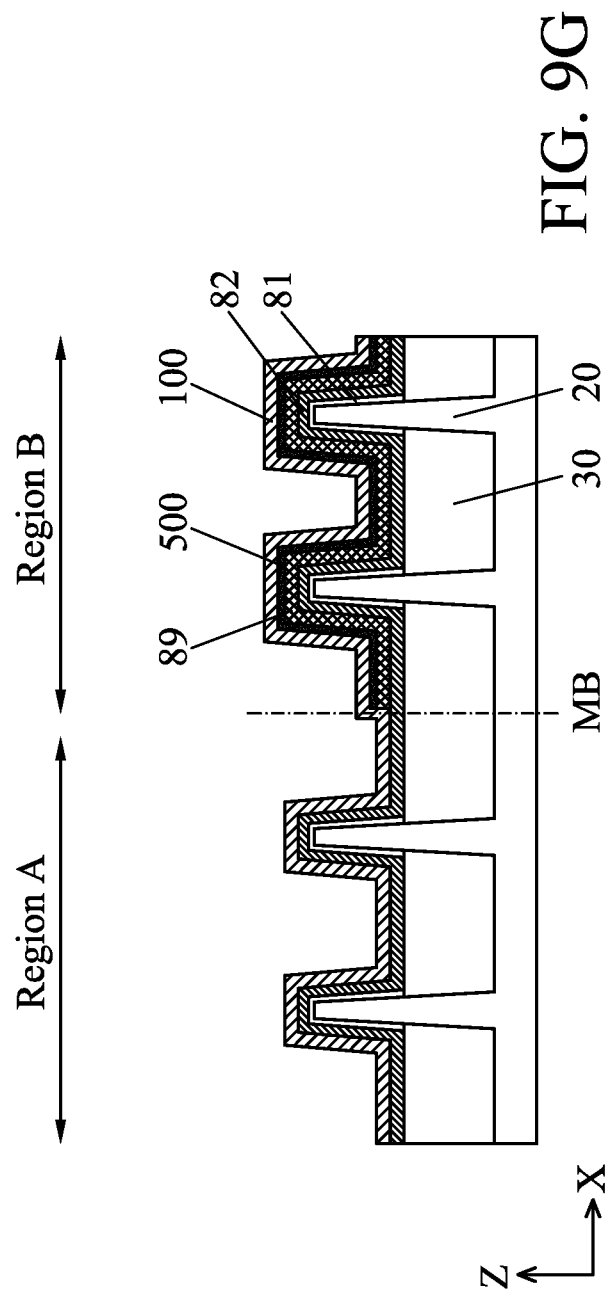

Subsequently, as shown in FIG. 9G, a WFM layer 100 is formed over the structure of FIG. 9F. In some embodiments, instead of the WFM layer 100, another WFM layer 89 (89-2) having the same as or similar composition to WFM layer 89 (89-1) is formed.

Figure 9H:
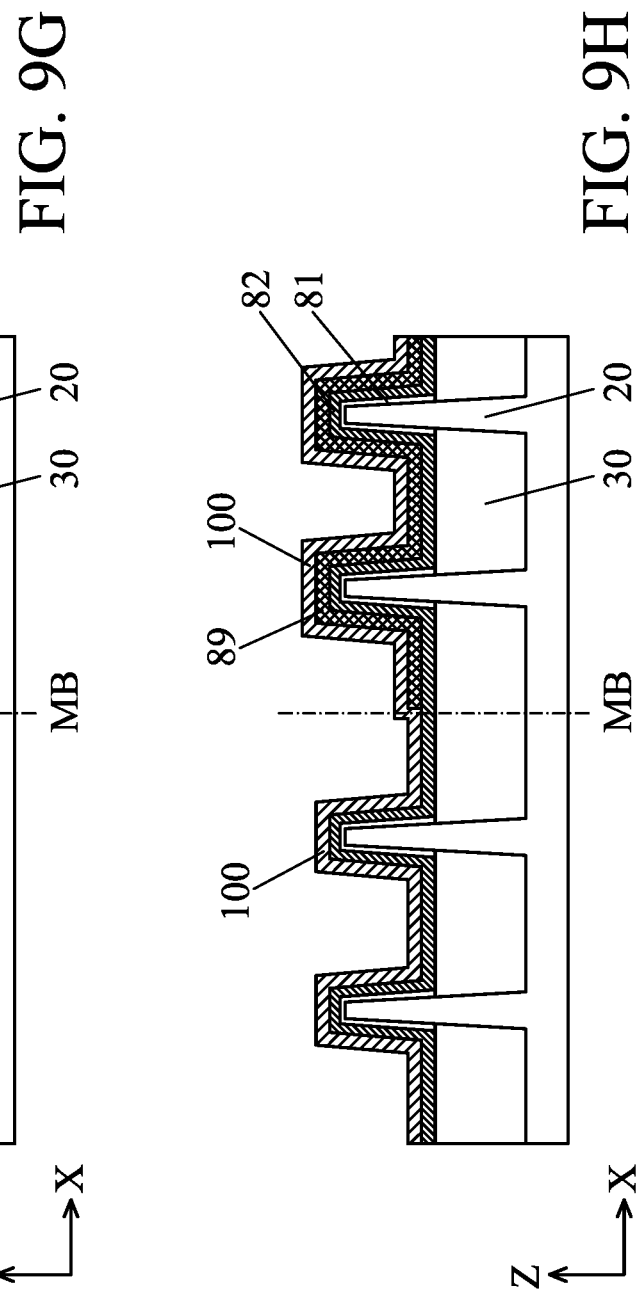

In other embodiments, the adhesion enhancement layer 500 is removed and then the WFM layer 100 is formed as shown in FIG. 9H. In particular, when the adhesion enhancement layer 500 is made of an insulating material (SiN, AlO$_x$, CoO$_x$ or TiO$_x$), the adhesion enhancement layer 500 is removed.

The adhesion enhancement layer 500 is employed in patterning the WFM layer 89-1 as shown in FIGS. 8A and 8B, and also is employed in patterning the WFM layer 89-2 as shown in FIGS. 8C and 8D. Further, an adhesion enhancement layer is employed above the WFM layer 100 when the WFM layer 100 is patterned.

FIGS. 10A, 10B, 10C, 10D, 10E, 10F, 10G, 10H and 10I show cross sectional views of various stages of a sequential manufacturing process of a semiconductor device according to embodiments of the present disclosure. It is understood that in the sequential manufacturing process, one or more additional operations can be provided before, during, and after the stages shown in FIGS. 10A-10H and some of the operations described below can be replaced or eliminated for additional embodiments of the method. The order of the operations/processes may be interchangeable. Materials, configurations, dimensions, processes and/or operations as described with respect to embodiments of FIGS. 1-9H can be employed in the following embodiments, and detailed description thereof may be omitted.

As shown in FIG. 10A, the semiconductor device includes, for example, three regions R1, R2 and R3 for FETs having different threshold voltage. In some embodiments, two or three of the FETs are controlled by the same gate electrode (e.g., the gate electrode extends over the two or three regions), and thus two or three regions are continuously formed. In other embodiments, the regions are separately formed.

In some embodiments, an adhesion enhancement layer is used in patterning a high-k gate dielectric layer. In some embodiments, the gate dielectric layer includes multiple layers having a base high-k dielectric layer 82 and one or more dipole high-k dielectric layer 182, 282 disposed on the base high-k dielectric layer 82. In some embodiments, the dipole high-k dielectric layer includes one of La$_2$O$_3$, Lu$_2$O$_3$, Sc$_2$O$_3$, SrO, ZrO$_2$, Y$_2$O$_3$, DyO$_x$, EuO$_x$ and Yb$_2$O$_3$. In some embodiments, a semiconductor device includes FETs having a high-k dielectric layer, FETs having a high-k dielectric layer and a dipole high-k dielectric layer on the high-k dielectric layer, and FETs having a high-k dielectric layer and two dipole high-k dielectric layers on the high-k dielectric layer. These FETs formed thereby provide different threshold voltages. In some embodiments, after the annealing operation, an optional wet etching is performed to remove the 182 and 282 layers partly or completely. In some embodiments, after the annealing operation, the wet etching operation is not performed and the 182 and 282 layers are kept in the gate stacks of the final FET devices.

In some embodiments, as shown in FIG. 10A, a first high-k dipole layer 182 is formed over the high-k dielectric layer 82 and an adhesion enhancement layer 510 is formed over the first dipole high-k dielectric layer 182. In some embodiments, the adhesion enhancement layer has a higher adhesion strength to the BARC layer than the first high-k dipole layer 182. In some embodiments, the adhesion enhancement layer 510 has a higher nitrogen concentration than the first high-k dipole layer 182.

In some embodiments, the adhesion enhancement layer 510 includes one or more of TiNX (where x is about 1.1 to 1.5), TiSiN, SiN, AlN and Al$_2$O$_3$. In some embodiments, the TiN$_x$ layer includes Ti in an amount of about 22 atomic % to about 35 atomic % and N in an amount of about 24 atomic % to about 51 atomic % (the rest is C and/or O). In some embodiments, the thickness of the adhesion enhancement layer 510 is in a range from about 0.2 nm to about 2 nm and is in a range from about 0.3 nm to about 1.5 nm in other embodiments. In some embodiments, the adhesion enhancement layer 510 includes a combination of Al$_2$O$_3$ and AlN layers. In some embodiments, the adhesion enhancement layer 510 includes a combination of Al$_2$O$_3$ and TiN layers.

Then, as shown in FIG. 10B, a BARC layer 202 and a photo resist layer 207 are formed over the adhesion enhancement layer. In some embodiments, the thickness of the BARC layer 202 is in a range from about 50 nm to about 2000 nm and is in a range from about 100 nm to about 200 nm in other embodiments.

Next, by using one or more lithography operations, the photo resist layer 207 is patterned as shown in FIG. 10C. Further, by using one or more etching operations (e.g., dry etching), the BARC layer 202 is patterned by using the patterned photo resist layer 207 as an etching mask, as shown in FIG. 10D.

Then, as shown in FIG. 10E, the adhesion enhancement layer 510 and the first dipole high-k dielectric layer 182 are etched from regions R1 and R2. In some embodiments, a wet etching is used to remove the adhesion enhancement layer 510 and the first dipole high-k dielectric layer 182 from regions R1 and R2. Since the adhesion layer 510 improves adhesion strength between the first dipole high-k dielectric layer 182 and the BARC layer 202, a peeling off of the BARC layer is prevented at the metal boundary between regions R3 and R2 or regions R2 and R1 and etching under the BARC layer 202 is also suppressed at region R3. It should be noted that in the absence of adhesion enhancement layer 510 the adhesion between BARC layer 202 and the first dipole high-k dielectric layer 182 may be insufficient at the region R3 and the wet chemicals (used during removal of high-k dielectric layer 182 layer from regions R1 and R2) may penetrate across the metal boundary into region R3 through gaps at this poorly bonded BARC- first dipole high-k dielectric layer interface and may cause unnecessary damage or etching of the first dipole high-k dielectric layer 182 from region R3. Subsequently, the photo resist layer 207 and the BARC layer 202 are removed from region R3. In some embodiments, a plasma ashing operation is performed and thereafter a wet ash cleaning operation is performed to remove the BARC residue from region R3. Since at the region R3, the adhesion enhancement layer 510 covers the first dipole high-k dielectric layer 182, any damage or loss to the first dipole high-k dielectric layer 182 on region R3 from atmospheric moisture, from the plasma of ashing process or from the wet cleaning process chemicals on the top of the fin structure is prevented. It should be noted that in absence of adhesion enhancement layer 510, the dipole high-k dielectric layers 182, 282 are highly hygroscopic in nature and thus may easily react with moisture and/or water during water based wet cleaning (e.g. during ash cleaning process). The moisture forms hydroxides (e.g., $La(OH)_3$) which have much lower k-value than the oxide and thus degrades FET device k-value, speed and/or performance.

Figure 10I:
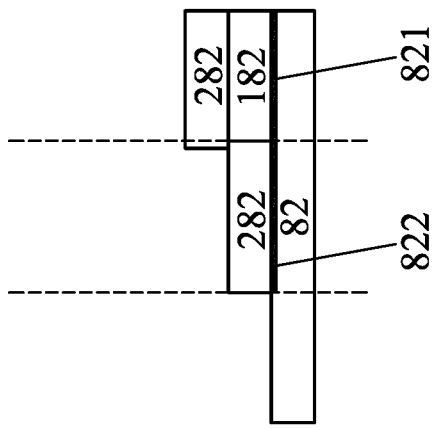
Figure 10H:
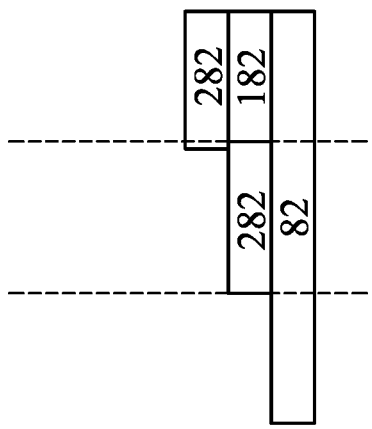
Figure 10G:
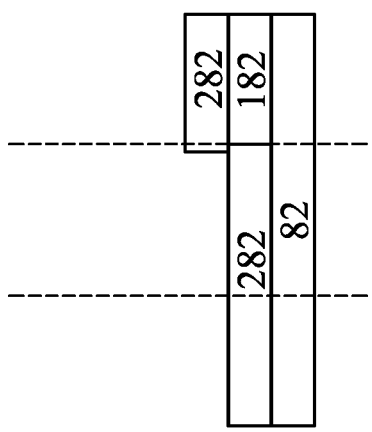

Further, in some embodiments, a second dipole high-k dielectric layer 282 is formed as shown in FIG. 10G. By using the similar techniques as shown in FIGS. 10B-10F, the second dipole high-k dielectric layer 282 is patterned, as shown in FIG. 10H. After the structure shown in FIG. 10H is formed, one or more work function adjustment material layers and a body gate electrode layer as explained above are formed. In some embodiments, an annealing operation is performed at a temperature between 400° C. to about 700° C. for about 2 sec to about 100 sec to drive-in the dipole doping elements from the dipole high-k dielectric layers 182, 282 into the base high-k dielectric layer 82, to form high-k dielectric layers 821 and 822 with different amounts of dopants, as shown in FIG. 10I. In some embodiments, the dipole doping elements includes one or more of La, Lu, Sc, Sr, Zr, Y, Dy, Eu and Yb, which is contained in dipole high-k dielectric layer 182, 282. In some embodiments, the diffusion layers 821 and 822 are formed at a part of the high-k dielectric layer 82 and in other embodiments, the high-k dielectric layer 82 is fully converted to the diffusion layer 821 and 822. The amount of the dipole dopant elements diffused into the gate dielectric layers 82 depends upon the thickness and/or numbers of dipole high-k dielectric layers. In some embodiments, an FET having a high-k dielectric layer and two dipole high-k dielectric layers on the high-k dielectric layer has a highest concentration of the dopant element than an FET having a high-k dielectric layer and one dipole high-k dielectric layer, and an FET having a high-k dielectric layer and no dipole high-k dielectric layer. In some embodiments, after the annealing operation, an optional wet etching is performed to remove the residues of the dipole layers 182 and 282 either partly or completely. In some embodiments, a wet etching operation is not performed so that the dipole high-k dielectric layers 182, 282 are kept in final gate structure of FET devices.

In some embodiments, the adhesion enhancement layer 510 is removed and in other embodiments, the adhesion enhancement layer 510 is not removed and remains as a part of the gate dielectric layer.

Figure 11:
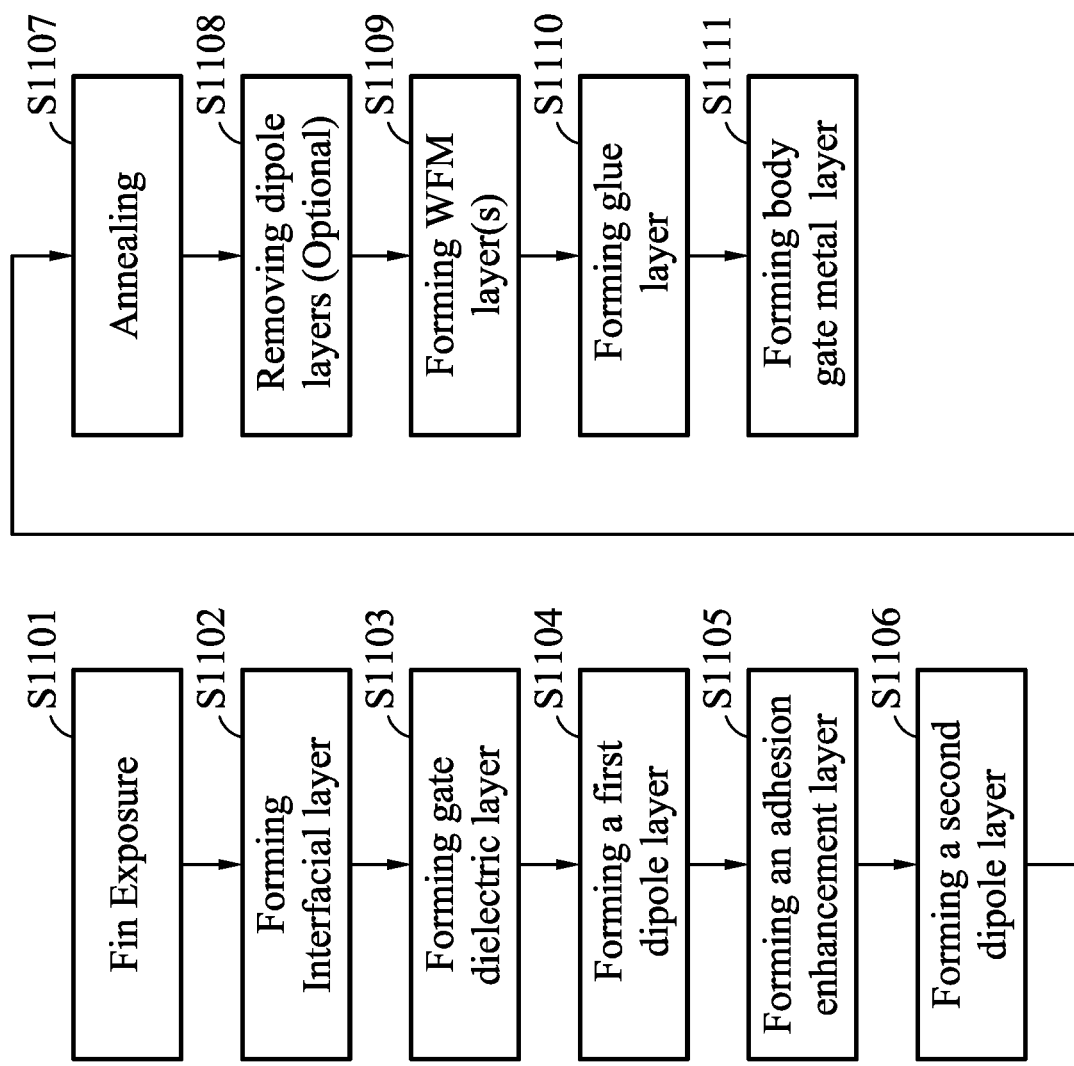
FIG. 11 shows a process flow of manufacturing a semiconductor device according to embodiments of the present disclosure.

FIG. 11 shows a process flow of manufacturing a semiconductor device according to embodiments of the present disclosure. FIGS. 12A, 12B, 12C, 12D, 12E and 12F show cross sectional views of various stages of a sequential manufacturing process of a semiconductor device according to embodiments of the present disclosure. It is understood that in the sequential manufacturing process, one or more additional operations can be provided before, during, and after the stages shown in FIGS. 12A-12F and some of the operations described below can be replaced or eliminated for additional embodiments of the method. The order of the operations/processes may be interchangeable. Materials, configurations, dimensions, processes and/or operations as described with respect to embodiments of FIGS. 1-10I can be employed in the following embodiments, and detailed description thereof may be omitted.

In FIGS. 12A-12E, three n-type FETs having different threshold voltages (N1' N2' and N3') and three p-type FETs having different threshold voltages (P1', P2' and P3') are provided. At S1101 of FIG. 11, channel regions of fin structures are exposed for a first n-type FET N1', a second n-type FET N2', a third n-type FET N3', a first p-type FET P1', a second p-type FET P2' and a third p-type FET P3', respectively, similar to S701 of FIG. 7. In some embodiments, the channel regions for the n-type FETs are made of Si and the channel regions for the p-type FETs are made of SiGe.

At S1102 of FIG. 11, interfacial layers 81N and 81P are formed on each of the channel regions 20 using chemical oxidation methods, similar to S702 of FIG. 7. At S1103 of FIG. 11, a gate dielectric layer (e.g., a high-k gate dielectric layer) 82 is formed on the interfacial layer 81N/81P, similar to S703 of FIG. 7.

At S1104 of FIG. 11, as shown in FIG. 12A, a first dipole layer 182 is formed over a high-k gate dielectric layer 82, and at S1105 of FIG. 11, an adhesion enhancement layer 510 is formed over the first dipole layer 182. Then, a BARC layer 200 and a photo resist layer 205 are formed and patterned to leave the patterned photo resist layer 205 and BARC layer 200 in the regions N3' and P1' as shown in FIG. 12A.

Then, as shown in FIG. 12B, the adhesion enhancement layer 510 and the first dipole layer 182 are removed by one or more etching operations. Further, the photo resist layer 205, the BARC layer 200 and the adhesion enhancement layer 510 are removed from the regions N3' and P1'. In some embodiments, the adhesion enhancement layer 510 is not removed from the regions N3' and P1'. Next, at S1106 of FIG. 11, as shown in FIG. 12C, a second dipole layer 282 is formed in the regions N1', N2', N3', P1', P2' and P3'. Further, by using one or more lithography and etching operations, the second dipole layer 282 is removed from the regions N1' and P3' as shown in FIG. 12D. In some embodiments, an adhesion enhancement layer is formed on the second dipole layer and a bilayer of BARC and photo resist is formed on the adhesion enhancement layer, similar to the operations as explained with respect to FIGS. 12A and 12B.

Then, at S1107 of FIG. 11, an annealing operation is performed as shown in FIG. 12E. In some embodiments, the annealing operation is performed at a temperature in a range from about 400° C. to about 700° C. for about 2 sec to about 100 sec to drive-in the dipole doping elements from the dipole high-k dielectric layers 182, 282 into the high-k dielectric layer 82, to form high-k dielectric layers 821 and 822 with different amounts of dopants, as shown in FIG. 12E. In some embodiments, the dipole doping elements includes one or more of La, Lu, Sc, Sr, Zr, Y, Dy, Eu and Yb, which is contained in dipole high-k dielectric layer 182, 282. In some embodiments, the diffusion layers 821 and 822 are formed at a part of the high-k dielectric layer 82 and in other embodiments, the high-k dielectric layer 82 is fully converted to the diffusion layer 821 and 822. The amount of the dipole dopant elements diffused into the gate dielectric layers 82 depends upon the thickness and/or numbers of dipole high-k dielectric layers. In some embodiments, an FET having a high-k dielectric layer and two dipole high-k dielectric layers on the high-k dielectric layer has a highest concentration of the dopant element than an FET having a high-k dielectric layer and one dipole high-k dielectric layer, and an FET having a high-k dielectric layer and no dipole high-k dielectric layer. In some embodiments, after the annealing operation, at S1108 of FIG. 11, an optional wet etching is performed to remove the residues of the dipole layers 182 and 282 either partly or completely, as shown in FIG. 12F. In some embodiments, a wet etching operation is not performed so that the dipole high-k dielectric layers 182, 282 are kept in final gate structure of FET devices. Subsequently, at S1109 of FIG. 11, one or more WFM layers are formed similar to the operations as explained with respect to FIGS. 7-9H. Further, a cap layer is optionally formed, and at S1110 of FIG. 11, a glue layer is formed and then a body gate metal layer 88 is formed at S1111 of FIG. 11, similar to S712-S714 of FIG. 7.

It will be understood that not all advantages have been necessarily discussed herein, no particular advantage is required for all embodiments or examples, and other embodiments or examples may offer different advantages.

In accordance with one aspect of the present application, a semiconductor device includes a first field effect transistor (FET) including a first gate structure disposed over a first channel region, and a second FET having different conductivity type than the first FET and including a second gate structure disposed over a second channel region. The first gate structure includes a first gate dielectric layer over the first channel region, a first work function adjustment material layer over the first gate dielectric layer, an adhesion enhancement layer disposed over the first work function adjustment material layer, and a first metal gate electrode layer. The second gate structure includes a second gate dielectric layer over the second channel region, a second work function adjustment material layer over the second gate dielectric layer, and a second metal gate electrode layer, and the second gate structure does not include the adhesion enhancement layer. The first work function adjustment material layer is nitrogen free or contains nitrogen in an amount less than 50 atomic % and the adhesion enhancement layer contains nitrogen in a range from 55 atomic % to 75 atomic %. In one or more of the foregoing and following embodiments, the adhesion enhancement layer has a higher nitrogen concentration than the first work function adjustment material layer. In one or more of the foregoing and following embodiments, the adhesion enhancement layer includes one or more of $TiN_x$, where x is about 1.1 to 1.5, TiSiN, and AlN. In one or more of the foregoing and following embodiments, the first work function adjustment material layer include one or more of WN, WCN, MoN and Ru. In one or more of the foregoing and following embodiments, the second work function adjustment material layers include one or more of TaAl, TaAlC, TiAl and TiAlC. In one or more of the foregoing and following embodiments, a thickness of the adhesion enhancement layer is in a range from 0.2 nm to 2 nm. In one or more of the foregoing and following embodiments, the first gate structure further includes a third work function adjustment material layer made of a same material as the second work function adjustment material layer and disposed over the adhesion enhancement layer. In one or more of the foregoing and following embodiments, a variation of a thickness each of the first gate dielectric layer, the first work function adjustment material layer and the adhesion enhancement layer of the first channel region is more than 0.5% to less than 5.0%. In one or more of the foregoing and following embodiments, a thickness and compositions of all layers in the first gate structure are constant throughout the first FET.

In accordance with another aspect of the present disclosure, a semiconductor device includes a first gate dielectric layer disposed over a channel region, a second gate dielectric layer disposed over the first gate dielectric layer, an adhesion enhancement layer disposed over the second gate dielectric layer, one or more work function adjustment material layers disposed over the adhesion enhancement layer, and a body gate electrode layer disposed over the one or more work function adjustment material layers. The second gate dielectric layer includes an oxide of one or more of La, Lu, Sc, Sr, Zr, Y, Dy, Eu and Y, and the adhesion enhancement layer includes one or more of $TiN_x$, where x is about 1.1 to 1.5, TiSiN, SiN, AlN and $Al_2O_3$. In one or more of the foregoing and following embodiments, the first gate dielectric layer includes a high-k dielectric material different from the second gate dielectric layer. In one or more of the foregoing and following embodiments, the one or more work function adjustment material layers include one or more of WN, WCN, MoN and Ru. In one or more of the foregoing and following embodiments, the one or more work function adjustment material layers include one or more of TaAl, TaAlC, TiAl and TiAlC. In one or more of the foregoing and following embodiments, the one or more work function adjustment material layers include one or more of TiN, TiSiN, TaN and TaSiN. In one or more of the foregoing and following embodiments, a thickness of the adhesion enhancement layer is in a range from 0.3 nm to 1.5 nm. In one or more of the foregoing and following embodiments, a semiconductor device further includes a third gate dielectric layer disposed between the second gate dielectric layer and the one or more work function adjustment material layer.

In accordance with another aspect of the present disclosure, a semiconductor device includes a gate structure disposed over a channel region and a source/drain region. The gate structure includes a gate dielectric layer over the channel region, one or more work function adjustment material layers over the gate dielectric layer, and a metal gate electrode layer over the one or more work function adjustment material layers. An adhesion enhancement layer is disposed between adjacent two work function adjustment material layers. In one or more of the foregoing and following embodiments, the adhesion enhancement layer has a higher nitrogen concentration than a work function adjustment material layer of the two work function adjustment material layers disposed closer to the gate dielectric layer. In one or more of the foregoing and following embodiments, the adhesion enhancement layer includes one or more of $TiN_x$, where x is about 1.1 to 1.5, TiSiN and AlN. In one or more of the foregoing and following embodiments, the work function adjustment material layers include a first layer made of one or more of WN, WCN, MoN and Ru, and the adhesion enhancement layer is disposed on the first layer. In one or more of the foregoing and following embodiments, the work function adjustment material layers include a first layer made of one or more of TaAl, TaAlC, TiAl and TiAlC, and the adhesion enhancement layer is disposed below the first layer. In one or more of the foregoing embodiments, a thickness of the adhesion enhancement layer is in a range from 0.2 nm to 2 nm.

In accordance with another aspect of the present disclosure, in a method of manufacturing a semiconductor device, a gate dielectric layer is formed over a channel region made of a semiconductor material, a first work function adjustment material layer is formed over the gate dielectric layer, an adhesion enhancement layer is formed on the first work function adjustment material layer, a mask layer including an antireflective organic material layer is formed on the adhesion enhancement layer, and the adhesion enhancement layer and the first work function adjustment material layer are patterned by using the mask layer as an etching mask. The adhesion enhancement layer has a higher adhesion strength to the antireflective organic material layer than the first work function adjustment material layer. The first work function adjustment material layer is nitrogen free or contains nitrogen in an amount less than 50 atomic % and the adhesion enhancement layer contains nitrogen in a range from 55 atomic % to 75 atomic %. In one or more of the foregoing and following embodiments, a nitrogen concentration of the adhesion enhancement layer is higher than a nitrogen concentration of the first work function adjustment material layer. In one or more of the foregoing and following embodiments, the adhesion enhancement layer includes one or more of $TiN_x$, where x is about 1.1 to 1.5, TiSiN and AlN. In one or more of the foregoing and following embodiments, the mask layer is removed, and a second work function adjustment material layer is formed over the adhesion enhancement layer. In one or more of the foregoing and following embodiments, the adhesion enhancement layer includes one or more of $TiN_x$, where x is about 1.1 to 1.5, TiSiN, SiN, AN and $Al_2O_3$. In one or more of the foregoing and following embodiments, the mask layer is removed, the adhesion enhancement layer is removed, and a second work function adjustment material layer is formed over the first work function adjustment material layer. In one or more of the foregoing and following embodiments, the adhesion enhancement layer is formed by nitridation of a surface region of the first work function adjustment material layer. In one or more of the foregoing and following embodiments, a thickness of the adhesion enhancement layer is in a range from 0.2 nm to 2 nm.

In accordance with another aspect of the present disclosure, in a method of manufacturing a semiconductor device, a first gate dielectric layer is formed over a channel region made of a semiconductor material, a second gate dielectric layer is formed over the first gate dielectric layer, an adhesion enhancement layer is formed on the second gate dielectric layer, a mask layer including an organic material is formed on the adhesion enhancement layer, and the adhesion enhancement layer and the second gate dielectric layer are patterned by using the mask layer as an etching mask. The adhesion enhancement layer includes one or more of $TiN_x$, where x is about 1.1 to 1.5, TiSiN, SiN, AlN and $Al_2O_3$. In one or more of the foregoing and following embodiments, the second gate dielectric layer include an oxide of one or more of La, Lu, Sc, Sr, Zr, Y, Dy, Eu and Y. In one or more of the foregoing and following embodiments, the mask layer is removed, and the adhesion enhancement layer is removed. In one or more of the foregoing and following embodiments, after the adhesion enhancement layer is removed, a third gate dielectric layer is formed over the second gate dielectric layer. In one or more of the foregoing and following embodiments, the second gate dielectric layer and the third gate dielectric layer includes an oxide of one or more of La, Lu, Sc, Sr, Zr, Y, Dy, Eu and Y, respectively. In one or more of the foregoing and following embodiments, the mask layer is removed, and a third gate dielectric layer is formed over the adhesion enhancement layer.

In accordance with another aspect of the present disclosure, in a method of manufacturing a semiconductor device, a first layer is formed over a channel region made of a semiconductor material, a adhesion enhancement layer is formed on the first layer, a bottom antireflective layer made of an organic material is formed on the adhesion enhancement layer, a photo resist pattern is formed over the bottom antireflective layer, a part of the bottom antireflective layer is patterned by using the photo resist pattern as an etching mask, a part of the first layer is patterned by using the patterned bottom antireflective layer as an etching mask, the photo resist pattern and the patterned bottom antireflective layer are removed, and a second layer is formed over the first layer. In one or more of the foregoing and following embodiments, the adhesion enhancement layer has a higher nitrogen concentration than the first layer. In one or more of the foregoing and following embodiments, the first layer is an oxide layer. In one or more of the foregoing and following embodiments, the first layer is a conductive layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first field effect transistor (FET) including a first gate structure disposed over a first channel region; and
   a second FET having a different conductivity type than the first FET and including a second gate structure disposed over a second channel region, wherein:
   the first gate structure includes:
     a first gate dielectric layer over the first channel region;
     a first work function adjustment material layer over the first gate dielectric layer;
     an adhesion enhancement layer disposed over the first work function adjustment material layer; and
     a first metal gate electrode layer, the second gate structure includes:
     a second gate dielectric layer over the second channel region;
     a second work function adjustment material layer over the second gate dielectric layer; and
     a second metal gate electrode layer, and
   the first work function adjustment material layer is nitrogen free or contains nitrogen in an amount less than 50 atomic % and the adhesion enhancement layer contains nitrogen in a range from 55 atomic % to 75 atomic %, and
   the second gate structure does not include the adhesion enhancement layer.

2. The semiconductor device of claim 1, wherein the adhesion enhancement layer has a higher nitrogen concentration than the first work function adjustment material layer.

3. The semiconductor device of claim 1, wherein the adhesion enhancement layer includes one or more of $TiN_x$, where x is about 1.1 to 1.5, TiSiN or AlN.

4. The semiconductor device of claim 1, wherein the first work function adjustment material layer include one or more of WN, WCN, MON or Ru.

5. The semiconductor device of claim 1, wherein the second work function adjustment material layers include one or more of TaAl, TaAlC, TiAl or TiAlC.

6. The semiconductor device of claim 1, wherein a thickness of the adhesion enhancement layer is in a range from 0.2 nm to 2 nm.

7. The semiconductor device of claim 1, wherein the first gate structure further includes a third work function adjustment material layer made of a same material as the second work function adjustment material layer and disposed over the adhesion enhancement layer.

8. The semiconductor device of claim 1, wherein a variation of a thickness each of the first gate dielectric layer, the first work function adjustment material layer and the adhesion enhancement layer of the first channel region is more than 0.5% to less than 5.0%.

9. A semiconductor device, comprising:
a first gate dielectric layer disposed over a channel region;
a second gate dielectric layer disposed over the first gate dielectric layer;
a first work function adjustment material layer disposed over the second gate dielectric;
an adhesion enhancement layer disposed over the first work function adjustment material layer;
one or more second work function adjustment material layers disposed over the adhesion enhancement layer; and
a body gate electrode layer disposed over the one or more second work function adjustment material layers, wherein:
the second gate dielectric layer is an oxide of one or more of La, Lu, Sc, Sr, Zr, Y, Dy, Eu or Y,
the adhesion enhancement layer includes one or more of $TiN_x$, where x is about 1.1 to 1.5, TiSiN, SiN, AlN or $Al_2O_3$, and
the first work function adjustment material layer contains nitrogen in an amount less than 50 atomic % and the adhesion enhancement layer contains nitrogen in a range from 55 atomic % to 75 atomic %.

10. The semiconductor device of claim 9, wherein the first gate dielectric layer includes a high-k dielectric material different from the second gate dielectric layer.

11. The semiconductor device of claim 9, wherein the one or more second work function adjustment material layers include one or more of WN, WCN, MON or Ru.

12. The semiconductor device of claim 9, wherein the one or more second work function adjustment material layers include one or more of TaAl, TaAlC, TiAl or TiAlC.

13. The semiconductor device of claim 9, wherein a thickness of the adhesion enhancement layer is in a range from 0.3 nm to 1.5 nm.

14. The semiconductor device of claim 9, further comprising a third gate dielectric layer disposed between the second gate dielectric layer and the one or more second work function adjustment material layer.

15. A semiconductor device, comprising:
a gate structure disposed over a channel region; and
a source/drain region, wherein:
the gate structure includes:
a gate dielectric layer over the channel region;
two or more work function adjustment material layers over the gate dielectric layer;
a metal gate electrode layer over the two or more work function adjustment material layers; and
an adhesion enhancement layer is disposed between two adjacent work function adjustment material layers,
wherein the adhesion enhancement layer has a higher nitrogen concentration in a range from 55 atomic % to 75 atomic %, and
a work function adjustment material layer of the two work function adjustment material layers disposed closer to the gate dielectric layer has a nitrogen concentration in an amount of less than 50 atomic %.

16. The semiconductor device of claim 15, wherein the adhesion enhancement layer includes one or more of $TiN_x$, where x is about 1.1 to 1.5, TiSiN and AlN.

17. The semiconductor device of claim 16, wherein the work function adjustment material layers include a first layer made of one or more of WN, WCN, MON and Ru, and the adhesion enhancement layer is disposed on the first layer.

18. The semiconductor device of claim 16, wherein the work function adjustment material layers include a first layer made of one or more of TaAl, TaAlC, TiAl and TiAlC, and the adhesion enhancement layer is disposed below the first layer.

19. The semiconductor device of claim 15, wherein a thickness of the adhesion enhancement layer is in a range from 0.2 nm to 2 nm.

20. The semiconductor device of claim 15, wherein the gate dielectric layer includes a first gate dielectric layer and a second gate dielectric layer made of a different material than the first gate dielectric layer disposed over the first gate dielectric layer.

* * * * *